US012321050B2

(12) United States Patent
Miao et al.

(10) Patent No.: US 12,321,050 B2
(45) Date of Patent: Jun. 3, 2025

(54) METHODS AND SYSTEMS FOR FREQUENCY CONVERSION AND MODULATION USING SOLID-STATE DEFECTS

(71) Applicant: The University of Chicago, Chicago, IL (US)

(72) Inventors: Kevin C. Miao, Chicago, IL (US); Samuel J. Whiteley, Chicago, IL (US); David D. Awschalom, Chicago, IL (US)

(73) Assignee: The University of Chicago, Chicago, IL (US)

( * ) Notice: Subject to any disclaimer, the term of this patent is extended or adjusted under 35 U.S.C. 154(b) by 853 days.

(21) Appl. No.: 17/435,987

(22) PCT Filed: Mar. 4, 2020

(86) PCT No.: PCT/US2020/020939
§ 371 (c)(1),
(2) Date: Sep. 2, 2021

(87) PCT Pub. No.: WO2020/180956
PCT Pub. Date: Sep. 10, 2020

(65) Prior Publication Data
US 2022/0155621 A1 May 19, 2022

Related U.S. Application Data

(60) Provisional application No. 62/814,070, filed on Mar. 5, 2019.

(51) Int. Cl.
*H04B 10/00* (2013.01)
*G02F 1/03* (2006.01)
*H04J 14/00* (2006.01)

(52) U.S. Cl.
CPC .......... *G02F 1/0344* (2013.01); *G02F 1/0327* (2013.01)

(58) Field of Classification Search
CPC .......... H04B 10/70; G02F 1/03; G02F 1/0344
See application file for complete search history.

(56) References Cited

U.S. PATENT DOCUMENTS 9,335,606 B2   5/2016   Hanson et al.
9,350,460 B2   5/2016   Paik
(Continued)

OTHER PUBLICATIONS

Magnusson, Björn et al.; "Excitation properties of the divacancy in 4H-SiC"; retrieved from the Internet at https://arxiv.org/abs/1804.01167; Phys. Rev. B 98, 195202; Oct. 17, 2018; 28 pages.
(Continued)

*Primary Examiner* — Daniel G Dobson
(74) *Attorney, Agent, or Firm* — Crowell & Moring LLP

(57) ABSTRACT

The disclosure is directed to devices, systems, and methods for performing quantum state-mediated microwave-to-optical energy conversion. Such quantum state-mediated energy conversion may be achieved via coherent interactions between an optical excitation and microwave electric field mediated by various quantum states in a defect embedded in a crystalline lattice. Such energy conversion enables coherent electro-optical modulation of optical emission from the defect, microwave-optical transduction, optical detection of microwave, and optical frequency mixing in the optical emission from the defect. The optical emission from the defect maintains and carries quantum coherence in the defect. Such devices and methods may be applied in quantum information processing systems.

19 Claims, 13 Drawing Sheets

(56) References Cited

U.S. PATENT DOCUMENTS

| | | | |
|---|---|---|---|
| 9,509,280 B1 | 11/2016 | Abdo et al. | |
| 2014/0291490 A1* | 10/2014 | Hanson | H01L 29/127 |
| | | | 250/214 R |
| 2017/0091647 A1 | 3/2017 | Abdo | |

OTHER PUBLICATIONS

International Search Report mailed May 27, 2020 for International Application No. PCT/US20/20939.
Falk et al. "Polytype control of spin qubits in silicon carbide" Nature Communications, May 7, 2013, 7 pages.
Klimov et al. "Electrically Driven Spin Resonance in Silicon Carbide Color Centers" Physical Review Letters, Feb. 28, 2014, 5 pages.
Whiteley et al. "Spin-phonon interactions in silicon carbide addressed by Gaussian acoustics" Nature Physics, vol. 15, May 2019, 7 pages.
Tamarat et al. "Stark Shift Control of Single Optical Centers in Diamond" Physical Review Letters, Aug. 25, 2006, 4 pages.
Bassett et al., "Electrical Tuning of Single Nitrogen-Vacancy Center Optical Transitions Enhanced by Photoinduced Fields" Physical Review Letters, Dec. 23, 2011, 5 pages.
De las Casas et al., "Stark tuning and electrical charge state control of single divacancies in silicon carbide" Applied Physical Letters, Dec. 28, 2017, 6 pages.
Falk et al. "Electrically and Mechanically Tunable Electron Spins in Silicon Carbide Color Centers" Physical Review Letters, May 9, 2014, 6 pages.
Golter et al. "Optomechanical Quantum Control of a Nitrogen-Vacancy Center in Diamond" Physical Review Letters, Apr. 8, 2016, 6 pages.
Chen et al., "Orbital State Manipulation of a Diamond Nitrogen-Vacancy Center Using a Mechanical Resonator" Physical Review Letters, 2018, 6 pages.
Calusine et al. "Cavity-Enhanced Measurements of Defect Spins in Silicon Carbide" Physical Review Applied, 2016, 6 pages.
Bracher et al. "Selective Purcell enhancement of two closely linked zero-phonon transitions of a silicon carbide color center" PNAS, Apr. 17, 2018, 6 pages.
Christle et al., "Isolated Spin Qubits in SiC with a High-Fidelity Infrared Spin-to-Photon Interface" Physical Review X, Jun. 23, 2017, 12 pages.
Koehl et al., "Room temperature coherent control of defect spin qubits in silicon carbide" Letter Research, vol. 479, Nov. 3, 2011, 5 pages.
Christle et al., "Isolated electron spins in silicon carbide with millisecond coherence times" Natural Materials, vol. 14, Feb. 2015, 4 pages.
Korsch et al. "On two-dimensional Bessel functions" Journal of Physics A: Mathematical and General, 2006, 19 pag es.
Shevchenko et al. "Landau-Zener-Stückelberg interferometry" Physics Report, vol. 492, 2010, 30 pages.
Oliver et al., "Mach-Zehnder Interferometryin a Strongly Driven Superconducting Qubit" Science Magazine, vol. 310, 5 pages.
Batalov et al., "Temporal Coherence of Photons Emitted by Single Nitrogen-Vacancy Defect Centers in Diamond Using Optical Rabi-Oscillations" Physical Review Letters, Feb. 22, 2008, 4 pages.
Dolde et al. "Electric-field sensing using single diamond spins" Nature Physics, vol. 7, Jun. 2011, 5 pages.
Jamonneau et al., "Competition between electric field and magnetic field noise in the decoherence of a single spin in diamond" Physcial Review B, vol. 93, Jan. 25, 2016, 5 pages.
Seo et al. "Quantum decoherence dynamics of divacancy spins in silicon carbide" Nature Communications, Sep. 29, 2016, 9 pages.
De Lange et al., "Universal Dynamical Decoupling ofa Single Solid-State Spin from a Spin Bath" Science Magazine, vol. 330, Oct. 1, 2010, 4 pages.
Kepesidis et al., "Phonon cooling and lasing with nitrogen-vacancy centers in diamone" Physical Review B vol. 88, Aug. 27, 2013, 12 pages.
Didier et al. "Fast Quantum Nondemolition Readout by Parametric Modulation of Longitudinal Qubit-Oscillator Interaction" Physical Review Letters, Nov. 13, 2015, 5 pages.
Harvey et al., "Coupling two spin qubits with high-impedance resonator" Physcial Review B, vol. 97, Mar. 14, 2018, 10 pages.
Bylander et al. "Interference and correlation of two independent photons" The European Physical Journal D, Dec. 17, 2002, 7 pages.
Miao et al., "Electrically-driven optical interferometry in silicon carbide spin defects" University of Chicago, Feb. 19, 2019, 8 pages.

* cited by examiner

1200 providing a crystalline lattice embedded with a defect
1210 driving the defect with an excitation optical field
1220 applying a microwave field to the defect simultaneously with the excitation optical field to modulate the absorption of the excitation optical field by the defect and optical emission from the defect  1230

Transducing input microwave photons into optical photons
1240

Detecting presence of microwave photons by detecting optical emission from the defect
1250

FIG. 12

1300 providing a crystalline lattice embedded with a defect coupled to a microwave resonator

1310 driving the defect with an excitation optical field

1320 generating microwave frequency photons from zero energy fluctuations in the microwave resonantor

1330

Transducing the microwave frequency photons to optical photons via optical emission from the defect

METHODS AND SYSTEMS FOR FREQUENCY CONVERSION AND MODULATION USING SOLID-STATE DEFECTS

CROSS REFERENCE

This application is a based on and claims priority to PCT Patent Application No. PCT/US20/20939, filed on Mar. 4, 2020, which is based on U.S. Provisional Patent Application No. 62/814,070, filed on Mar. 5, 2019, both of which herein are incorporated by reference in their entireties.

GOVERNMENT LICENSE RIGHTS

This invention was made with government support under W911NF-15-2-0058 awarded by the Army Research Office, FA9550-12-1-0004 awarded by the Air Force Office of Scientific Research, and 1641099 awarded by the National Science Foundation. The government has certain rights in the invention.

BACKGROUND

1. Technical Field

The present disclosure generally relates to methods and devices for microwave-to-optical conversion. In particular, the present disclosure relates to methods and devices of using AC parametric energy modulation of quantum states of defects in a solid-state host for performing electro-optical modulation, microwave-to-optical transduction, optical domain microwave detection, and optical frequency mixing.

2. Background Information

Solid-state defects may be used as building blocks for electro-optical and quantum information processing devices and systems. Various electro-optical and quantum information processing functions require that some of the properties of the solid-state defects be controllable/tunable via external electric, magnetic, or optical means.

SUMMARY

This application discloses methods, device, and systems for microwave-to-optical and optical-to-microwave frequency conversion based on solid state defects.

In one implementation, a method for performing electro-optical modulation is disclosed. The method may include providing a crystalline lattice embedded with a defect; driving an optical transition between a ground quantum state and an excited quantum state of the defect with an excitation optical field to generate an optical emission from the defect; and applying a microwave electric field to interact with the excitation optical field via the defect to modulate the optical emission from the defect.

In the implementation above, the excitation optical field may be resonant or near resonant with the optical transition between the ground quantum state and the excited quantum state of the defect.

In any one of the implementations above, a sum or difference between an optical frequency of the excitation optical field and one or a multiple of a microwave frequency of the microwave electric field is resonant with the optical transition between the ground quantum state and the excited quantum state of the defect.

In any one of the implementations above, the method may further include controlling an intensity of the excitation optical field to produce an amplitude modulation of the optical emission from the defect.

In any one of the implementations above, the method may further include controlling an amplitude of the microwave electric field to produce an amplitude modulation of the optical emission from the defect.

In any one of the implementations above, the method may further include controlling a microwave frequency of the microwave electric field to produce an amplitude or frequency modulation of the optical emission from the defect.

In any one of the implementations above, the method may further include controlling a number of spectral components or relative intensity between the spectral components of the optical emission from the defect by adjusting an amplitude or a microwave frequency of the microwave electric field.

In any one of the implementations above, the microwave electric field may include two microwave frequency tones, further comprising controlling; and the method may further include controlling a relative phase between the two microwave frequency tones to produce an amplitude modulation of the optical emission from the defect.

In the implementation above, a ratio of a frequency of a first of the two microwave frequency tones a frequency of a second of the two microwave frequency tones is a rational number.

In another implementation, a device for performing electro-optical modulation is disclosed. The device may include a crystalline lattice; a defect embedded in the crystal lattice; and two electrodes adapted to apply a microwave electric field to the defect. The device may be adapted to receive an excitation optical field to drive an optical transition between a ground quantum state and an excited quantum state of the defect the defect to generate an optical emission from the defect. The defect is adapted to serve as a quantum medium for an interaction between the excitation optical field and the microwave electric field applied via the two electrodes for modulating the optical emission from the defect.

In the device implementation above, the excitation optical field is resonant or near resonant with the optical transition between the ground quantum state and the excited quantum state of the defect.

In any one of the device implementations above, a sum or difference between an optical frequency of the excitation optical field and one or a multiple of a microwave frequency of the microwave electric field is resonant with the optical transition between the ground quantum state and the excited quantum state of the defect.

In any one of the device implementations above, the device may be adapted to receive the excitation optical field with intensity modulation to produce an amplitude modulation of the optical emission from the defect.

In any one of the device implementations above, the two electrodes may be adapted for controlling an amplitude of the microwave electric field to produce an amplitude modulation of the optical emission from the defect, or for controlling a microwave frequency of the microwave electric field to produce an amplitude modulation of the optical emission from the defect, or for control a number of spectral components or relative intensity between the spectral components of the optical emission from the defect by controlling an amplitude or a microwave frequency of the microwave electric field.

In any one of the device implementations above, wherein the two electrodes may be adapted to apply the microwave electric field comprising two microwave frequency tones and to control a relative phase between the two microwave frequency tones to produce an amplitude modulation of the optical emission from the defect.

In the device implementations above, a ratio of a frequency of a first of the two microwave frequency tones a frequency of a second of the two microwave frequency tones may be a rational number.

In another implementation, a method for performing microwave-to-optical transduction is disclosed. The method may include providing a crystalline lattice embedded with a defect; applying an excitation optical field to the defect to drive an optical transition between a ground quantum state and an excited quantum state of the defect; coupling one or more microwave photons to the defect; and converting, by the defect, the one or more microwave photons into an emitted optical photon from the defect as a result of an interaction between the excitation optical field and the one or more microwave photons via the defect.

In the method implementation above, the excitation optical field may be resonant or near resonant with the optical transition between the ground quantum state and the excited quantum state of the defect.

In any one of the method implementation above, a sum or difference between an optical frequency of the excitation optical field and a microwave frequency corresponding to the total energy of the one or more microwave photons may be resonant with the optical transition between the ground quantum state and the excited quantum state of the defect.

In any one of the method implementation above, the method may further include generating the one or more microwave photons by applying a microwave electric field from a microwave source to the defect.

In any one of the method implementation above, the method may further include generating the one or more microwave photons by a microwave resonator coupled to the defect. Optionally, the microwave resonator may include a superconducting microwave resonator. Optionally, generating the one or more microwave photons by the microwave resonator may include generating the one or more microwave photons as a result of a zero-point fluctuation in the microwave resonator. Optionally, the method may further include coupling an external microwave electric field to the microwave resonator for generating the one or more microwave photons.

In another implementation, a device for performing microwave-to-optical transduction is disclosed. The device may include a crystalline lattice; a defect embedded in the crystalline lattice; and two electrodes adapted to apply a microwave electric field to couple one or more microwave photons coupled to the defect. The device may be adapted to receive an excitation optical field at the defect to drive an optical transition between a ground quantum state and an excited quantum state of the defect, and convert the one or more microwave photons into an emitted optical photon emitted from the defect as a result of an interaction between the excitation optical field and the one or more microwave photons via the defect.

In the device implementation above, the excitation optical field may be resonant or near resonant with the optical transition between the ground quantum state and the excited quantum state of the defect, or a sum or difference between an optical frequency of the excitation optical field and a microwave frequency corresponding to the total energy of the one or more microwave photons may be resonant with the optical transition between the ground quantum state and the excited quantum state of the defect.

In another implementation, a device for performing microwave-to-optical transduction is disclosed. The device may include a crystalline lattice; a defect embedded in the crystal lattice; a microwave transmission line on the crystalline lattice comprising two electrodes; and a microwave resonator coupled to the microwave transmission line and to the defect, the microwave resonator being adapted for generating or storing one or more microwave photons. The device may be adapted to receive an excitation optical field to drive an optical transition between a ground quantum state and an excited quantum state of the defect; absorb an optical photon from the excitation optical field; and convert the one or more microwave photons into an emitted optical photon from the defect or convert the absorbed optical photon into the stored one or more microwave photons as a result of an interaction between the excitation optical field and the one or more microwave photons via the defect.

In the device implementation above, the excitation optical field may be resonant or near resonant with the optical transition between the ground quantum state and the excited quantum state of the defect, or a sum or difference between an optical frequency of the excitation optical field and a microwave frequency corresponding to the total energy of the one or more microwave photons may be resonant with the optical transition between the ground quantum state and the excited quantum state of the defect.

In any of the device implementation above, the one or more microwave photons may correspond to a cavity mode of the microwave resonator. The microwave resonator may further include a superconducting microwave resonator. Optionally, the one or more microwave photons may be generated by the microwave resonator as a result of a zero-point fluctuation in the microwave resonator. Optionally, the microwave transmission line may include a superconducting microwave transmission line.

In any one of the method or device implementations above, the crystalline lattice may include a silicon carbide crystalline lattice and the defect comprises a divacancy defect. The divacancy defect may optionally include a basally oriented divacancy in SiC, or a kh divacancy in SiC. The silicon carbide crystal lattice above may be optionally configured in a 4H polytype.

In another implementation, a system is disclosed. The system may include any one of the devices above.

BRIEF DESCRIPTION OF THE DRAWINGS

FIG. 12 shows a flow diagram of an example method for performing electro-optical modulation using defects in a solid-state host.

FIG. 13 shows a flow diagram of an example method for performing microwave-to-optical transduction using defects in a solid-state host.

DETAILED DESCRIPTION OF THE DISCLOSURE

Figure 1:
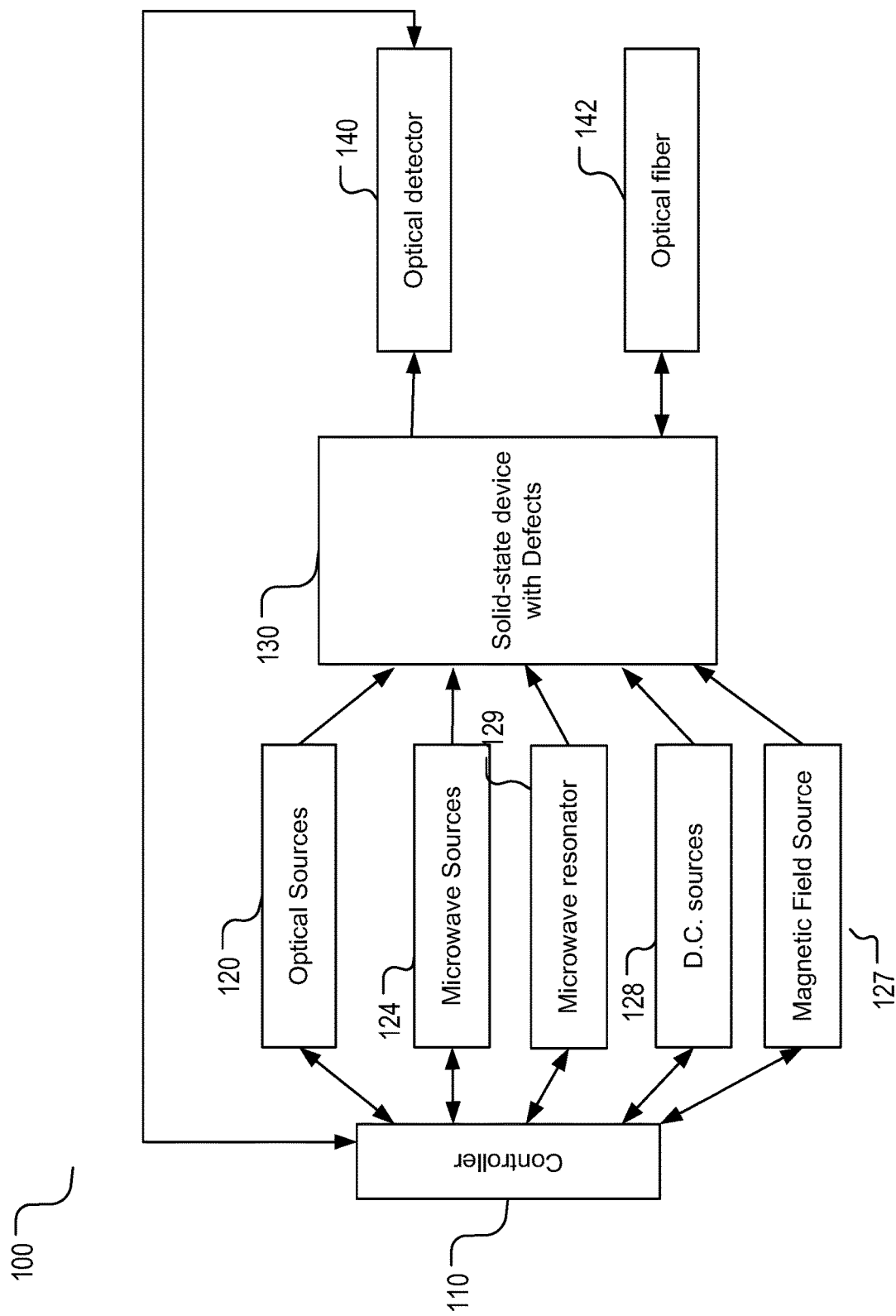
FIG. 1 is a schematic diagram of a system for performing microwave-to-optical conversion using defects in a solid-state host.

The present disclosure relates to methods and devices for manipulating quantum states of defects in a solid-state host to perform coherent microwave-to-optical energy conversion. Such coherent microwave-to-optical energy conversion may provide a basis for realizing electro-optical modulation of light absorption and light emission, microwave-to-optical transduction, optical detection of microwaves, and optical frequency mixing in a coherent manner using these solid-state defects. As an example, such coherent microwave-to-optical energy conversion may be realized by controlling the quantum states in the defects and influencing the optical transitions there between under coherent optical excitation using an AC parametric energy modulation induced by AC electric fields or microwaves. The term "AC parametric energy modulation" refers to energy level shifts of various orbital quantum states in the defects induced by a time-varying electric filed. The amount of energy shift, for example, may be determined by DC Stark shift coefficients for the orbital quantum states. Specific defects in a particular crystalline host are provided as examples. However, the underlying principles descried herein apply to other types of defects in various other solid-state hosts.

For example, under resonant or near resonant optical excitation by a coherent optical excitation field, absorption of the coherent optical excitation field by the defects and coherent optical emission of light from the defects may be controlled by amplitude, frequency, and/or phase of an externally applied microwave having one or more frequency tones. An electro-optical modulator by microwave may thus be constructed based on such solid-state defect systems.

Likewise, microwave photons may be converted/transduced by such defects into coherently emitted optical photons. For example, and as described in more detail below, one or more microwave photons having a particular energy may be transduced into a coherent photon via a coherent interaction between an optical excitation and the microwave photons via the defects when the coherent optical excitation field is tuned off resonance between an optical transition between two quantum states by a sum energy of one or more microwave photons.

By similar principles of operation, a presence of external microwave photons may be sensed via such solid-state defects under coherent optical excitation as transduced optical photons using a photo detector, thereby providing an optical detection of microwaves.

Further, such solid-state defects under resonant or near resonant coherent optical excitation may be incorporated into a microwave resonator, in which microwave photons generated from zero-point or vacuum fluctuation may be transduced into optical photons via the quantum states in the solid-state defects, thereby providing a photon generator (or a microwave-to-optical photon transducer) without application of any external microwave field. Further, microwave photons may be transduced from the optical excitation via the defect and added into the microwave resonator.

Still further, the photons emitted from the defects via the coherent interaction between the optical excitation and microwave may exhibit controllable optical frequency mixing characteristics. For example, under optical excitation by a coherent optical field resonant with an optical transition between two quantum states in the defects and a presence of a microwave, the coherent optical emission from the defects may exhibits optical frequency mixing have various optical spectral compositions. Such frequency mixing and spectral compositions may be controlled by varying the amplitude and/or frequency of the microwave.

The microwave-to-optical energy conversion and the various coherent optical devices introduced above and described in further detail below rely on quantum coherence and interference of quantum states of the solid-state defects and thus may be used to carry quantum information between two disparate energy scales in the electromagnetic spectrum (microwave and optical wave). This type of energy transduction, due to its quantum nature, may be referred to as microwave-to-optical quantum transduction. Such type of quantum transduction in conjunction with the long-lived coherent quantum states in these solid-state defects may form core components in a quantum information network, allowing for coupling/linking disparate quantum systems, and for local quantum processors and memories to interface with long distance communication networks via, for example, fiber optics.

FIG. 1 shows an example system 100 for implementing the coherent microwave-to-optical energy conversion above via the solid-state defects. The system 100 includes a solid-state device 130 embedded with defects 290 (FIG. 2), a controller 110, optical sources 120, microwave or AC sources 124, DC sources 128, magnetic field sources 127, a microwave resonator 129, optical detector 140, and optical fiber 142. In general, the system 100 may include the solid-state device 130 may further optionally include one or more of the other components above.

The controller 110 may be of any form of dedicated circuits, general-purpose instruments, and mobile or fixed electronic devices including but not limited to desktop computer, laptop computers, tablets, mobile phones, personal digital assistants, and the like. The controller 110 may be configured to provide a user interface for controlling the coherent microwave-to-optical energy conversion by the solid-state device with defects 130. The controller 110 may include communication interfaces, a processor, input/output (I/O) interfaces, storages, and display circuitry. The controller 110 may communicate with one or more of the other components of the system 100 to send/receive commands, data, or the like.

The optical sources 120 may be of any type of sources for electromagnetic radiation in the optical spectral range including but not limited to arc lamps, light emitting diodes (LEDs), and laser sources. The optical sources 120 may include one or more optical emitters. For achieving coherent excitation of the solid-state defects, the optical sources 120 may preferably comprise laser sources with sufficient optical coherence characteristics. The optical sources 120 may operate in either a pulsed mode or a continuous wave (CW) mode in time. The optical sources 120 may produce one or more optical beams to interact with the defects in the solid-state device 130 at different time points that may be configured by the controller 110. The one or more optical beams may propagate in free space, optical fibers, or a combination thereof. The one or more optical beams may be further processed by one or more optical components including but not limited to mirrors, lenses, prisms, optical polarizers, and objectives of confocal microscope. The one or more optical beams may be focused onto a particular region of the solid-state device 130 to address either an ensemble of detects or single defects embedded in the solid-state device 130. The one or more optical beams processed by the one or more optical components may be scanned across different regions of the solid-state device 130 so that the one or more optical beams may interact with different defects of the solid-state device 130 simultaneously or in a sequential manner.

The optical sources 120 may be wavelength tunable. For example, the optical sources 120 may include one or more lasers with tunable wavelength. The wavelength of such tunable lasers may be controlled by the controller 110 in conjunction with tunable optical elements having variable optical properties within the optical sources 120. The wavelength tunable optical sources 120 may be tuned to have an optical photon energy (or optical frequency) corresponding to one or more optical transitions between quantum states of the defects embedded in the solid-state device 130. The wavelength tunable optical sources 120 may be tuned to have an optical photon energy corresponding to an energy range around an optical resonance or optical transition between two particular quantum states of the defects. For example, the wavelength tunable optical sources 120 may be tuned to any energy in an energy range between an optical transition energy between the two particular quantum states of the defects minus 2 terahertz (THz) and plus 2 THz. The optical sources 120 may include optical fields of wavelength that are tuned off resonance with the optical transition between these two particular quantum states of the defects (e.g., detuned more than 2 THz). These off-resonance optical fields may be used to excite other optical transitions in the defects and used, for example, for preparation of the defects into some particular initial quantum states.

The system 100 may optionally include the microwave sources 124. The microwave sources 124 may include a device to generate an electromagnetic wave in the microwave-frequency range that may be applied to the defects embedded in the solid-state device 130. The microwave sources 124, for example, may include a microwave generator including but are not limited to an inductor, capacitor, microwave resonator, and a superconducting microwave resonator connected to a microwave-frequency alternating current (AC) power supply. The microwave generated by the microwave sources 124 may be directed onto a particular region of the solid-state device 130, and the particular region may comprise an ensemble of defects or single defects. The microwave may be scanned across different regions of the solid-state device 130 so that it may interact with different defects of the solid-state device 130. The microwave frequency may be tunable and the intensity (or electric field amplitude) of the microwave may be adjusted by the controller 110. In this disclosure, a microwave frequency may mean a frequency between 10 megahertz (MHz) and 300 gigahertz (GHz), inclusive. The microwave sources 124 may be external to the solid-state device 130 for generating the microwave field that may be applied to the defects. Alternatively, the microwave generator portion of the microwave source 134 may be integrated with the solid state device 130 as various electrodes and capacitive or inductive devices, and in such a configuration, the microwave sources may simply comprise microwave-frequency AC signal generator for supplying an AC driving signal to the integrated microwave generator.

The system 100 may optionally include the DC sources 128. The DC sources 128 may be used to generate and apply DC electric fields to the defects in the solid-state device 130. The DC electric fields may be applied for various purposes. For example, a DC electric field may be applied for device characterization, e.g., for characterizing DC Stark effect on the various quantum states in the defects embedded in the solid-state device 130. For another example, one or more DC fields may be applied to create carrier depletion or reduce an amount of unwanted free carriers in the solid-state host for the defects in the solid-state device 130, thereby stabilizing an electric environment for the defects by reducing electrical charge fluctuations that may cause spectral diffusion in optical excitation and/or emission in the defects. For another example, one or more DC fields may be applied to compensate or adjust crystal strain fields in the solid-state host for the defects in the solid-state device 130. DC electric fields for any of the purposes above may be applied to the entire or a particular region of the solid-state device 130. These regions may include one or more defects.

The system 100 may optionally include the magnetic field sources 127. The magnetic field sources 127 may produce static magnetic field. Such static magnetic field may be applied to the defects in the solid-state device 130 to mix spin states in the defects. The magnetic field sources 127 may, for example, include electric coils that generate magnetic field by circulating electric current. These electric coils may comprise superconducting coils. Alternatively, permanent magnets may be included in the system 100 or integrated with the solid-state device 130 for applying the magnetic field.

The system 100 may optionally include the microwave resonator 129. The defects in the solid-state device 130 may be enclosed by the microwave resonator such that microwave photons in the cavity modes of the microwave resonator may interact with the defects embedded in the solid-state device 130. The microwave resonator 129 may be integrated with the solid-state device 130. The microwave resonator 129 may be provided in forms including but not limited to a superconducting microwave resonator.

The system 100 includes the solid-state device 130. The solid-state device 130 includes a solid-state host embedded with one or more defects 290. The solid-state host, for example, may include but is not limited to a semiconductor crystalline lattice. Such a semiconductor crystalline lattice host may include but is not limited to a silicon carbide (SiC) lattice. A SiC lattice may be produced in various crystalline forms, including but not limited to 4H—SiC, 6H SiC, and 3C—SiC. Example defects suitable for providing the quantum states for enabling the coherent microwave-to-optical energy conversion as described above an in more detail below may include but are not limited to basally-oriented kh divacancy (VV) defects in, for example, 4H SiC. The solid-state host for the defects may be fabricated in various device geometries. For example, the solid host may include a SiC crystalline layer with a thickness from about 10 micrometers to about 10 millimeters. Such a layer may be embedded into a semiconductor homostructure or heterostructure (such as various p-i-p, p-i-n, or n-i-n structures).

The defects may be distributed in the solid-state host layer in any distribution profile and in any density. For example, the defects may be distributed with a density that is sufficiently low to allow for spatial addressability of single defects by the optical beams/fields from the optical sources 120 and/or microwaves from the microwave sources 124. The defects may be located, for example, within a depth of 0 to 50 micrometers to its top surface. The thermal environment for the solid-state device 130 may be further controlled. For example, the solid-state device 130 may be kept at some particular temperature or within some particular temperature range. For example, the solid-state device 130 may be kept at a low temperature, e.g., <20K. Defects may be created in the solid-host of the solid-state device 130 in various manners, as described in further detail below.

The defects embedded in the solid-state device 130 (such as kh divacancy in 4H SiC) may provide electro orbital and/or spin quantum states that may interact with the optical excitation fields from the optical sources 120 and the microwaves from the microwave sources 124 to achieve the coherent microwave-to-optical energy conversion and the various optical modulation, microwave detection, microwave-to-optical transduction and optical frequency mixing devices based on the coherent microwave-to-optical energy conversion.

The solid-state device 130 may include various electrodes. These electrodes may be used for applying DC electric fields as provided by the DC sources 128 for the purposes of, for example, depleting unwanted free carriers and compensating for strain electric field in the solid-state host for the defects. The electrodes may be further used to apply AC driving signals when the microwave generator of the microwave sources 124 and/or the microwave resonator 129 are integrated with the solid-state device 130. The electrodes may be fabricated by various means. For example, the electrodes may be lithographically patterned on the top surface of the solid-state device 130. For another example, the electrodes may be electrically accessible external of the solid-state device 130 but are otherwise embedded in the solid-state device 130. In some implementations, the electrodes may be include multiple sets of electrodes, where each set of electrodes may be used for locally applying microwave fields or DC electric fields to a subset of one or more detects embedded in the solid-state device 130.

In some implementations, the system 100 may include the optical detector 140. The optical detector 140 may be in the form of one or more of the following devices including but not limited to photo diodes, photomultiplier tubes (PMT), microchannel plates, charge-coupled devices (CODs), and complementary metal-oxide semiconductor (CMOS) sensors. Such optical detectors may be configured to detect optical emission from or determine optical absorption by the solid-state device 130. The optical detector 140 may be configured to detect single or multiple photons. The optical detector 140 may include additional and or auxiliary components including power supplies, electric bias circuit, active or passive quenching circuit, and the like. The optical detector 140 may further include other optical components for collection and processing of the optical emission or transmission from the solid-state device 130, including but not limited to spectral filters (such as spectrometers and dielectric/metal-film filters with suitable optical pass bands) and microscope optics (such as confocal optical microscope and multiple-photon microscope.

In some implementations, the system 100 may include the optical fiber 142. The optical fiber 142 may include a single or a bundle of optical fibers. The optical fiber 142 may receive optical photons generated by the solid-state device 130 and communicate the optical photons to one or more receiving systems/devices. A receiving system/device, for example, may include a quantum information processing device and/or quantum computing device. The receiving systems/devices may be located short distances away from the solid-state device 130, or alternatively, may be located long distances away from the solid-state device 130 at remote sites.

Figure 2:
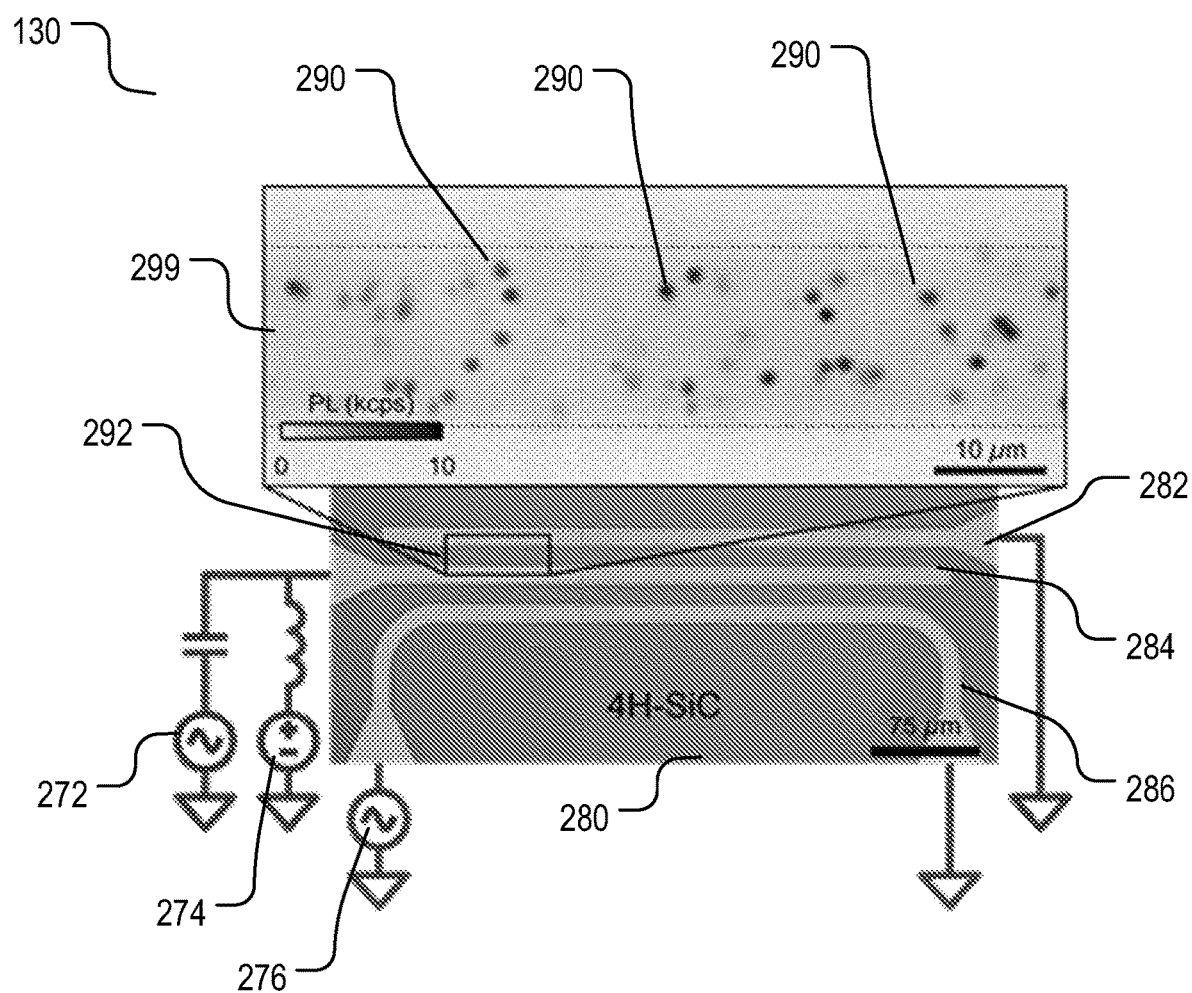
FIG. 2 shows an example solid-state device embedded with defects and fabricated with various electrodes for applying AC or DC electric fields.

FIG. 2 illustrates an example solid-state device 130 that may be included in the system 100. The solid-state device 130 shown in FIG. 2 includes a 4H SiC substrate 280 embedded with a plurality of VV defects as shown by 290 in the expanded micrographic view 299 of region 292 of the solid-state device 130. The solid-state device 130 further includes various electrodes 282, 283, and 284 fabricated from Ti/Au deposited and lithographically patterned over the SiC substrate 280. It is contemplated that any of electrodes 282, 283, and 284 could be made using suitable techniques and made of any suitable conducting materials (including transparent electrodes such as ITO electrodes for better optical accessibility to the defects). The electrodes may be patterned near the surface of the SiC substrate 280. Alternatively, they may be engraved into the SiC substrate 280 to some depth to enclose more defects in the SiC substrate 280 directly between these electrodes.

As shown in FIG. 2, in the illustrated implementation, the electrodes 282 and 284 form a coplanar capacitor. An AC signal may be applied between electrodes 284 and 282 (with electrode 282 serving as ground in this example configuration of FIG. 2) from an AC source 272, to drive such a coplanar capacitor to generate an electromagnetic wave and to exert a time-varying electric field to the defects 290 at, for example, microwave frequencies. Such microwave frequencies may be selected such that the microwave or AC electric field generated by the electrodes 284 and 282 are off resonance with transitions between spin states (with same electron orbitals) of the defects. As such, the microwave-frequency electric field generated by the electrodes 284 and 282 may induce time-varying energy level shifts of the electron orbital states of the defects via the AC parametric energy modulation without inducing any spin transitions (within a same electron orbital). The amplitude and frequency of the time-varying electric field applied to the defects via the electrodes 282 and 284 may be specified by the AC signal source 272, thereby providing a control of the resulting AC parametric energy modulation in the defects.

Additionally, a DC source 274 could be used to apply a DC electric field via the electrodes 284 and 282 to the defects in addition to the AC field, The DC electric field could be applied for the purposes of, for example, depletion and reduction of unwanted free charges and compensation of strain electrical field in the SiC lattice, thereby reducing inadvertent effect of spectral diffusion in optical excitation or emission spectra of the defects. The DC field may be further applied for purposes of device characterization, e.g., for measuring DC Stark shift of the electron energy levels and optical transition dipole moments in the defects, as described in more detail below.

The example solid-state device 130 illustrated in FIG. 2, further includes electrode 286 for applying a microwave via AC source 276 for driving spin transitions between spin states having the same electron orbitals in the defects. In particular, a microwave-frequency drive signal may be applied to the two ends of the electrode 286 acting as an inductor, as shown in FIG. 2, to generate a microwave at a frequency that may be resonant or near resonant with an electron spin transition within a same electron orbital in the defects, thereby driving the defects from one electron spin state to another electron spin state while maintaining the electron orbital state.

The example solid-state device 130 shown in FIG. 2 may be used in the system 100 shown in FIG. 1 as an optical modulator, a microwave-to-optical transducer, an optical microwave detector, and an optical frequency mixer. In some example implementations, as described in more detail below, light from the optical sources 120 of FIG. 1 such as a laser may be directed to the solid-state device 130 and may be resonant or near resonant with an optical transition between two electron orbital states of one or more defects in the solid-state device 130. An AC field having a preselected frequency in the microwave frequency range may be applied to the electrodes 284 and 282 to induce an AC parametric energy modulation on the electron orbitals of the defects. Such Stark effect of the electron orbitals of the defects may modify the absorption of the incident resonant or near resonant laser field and subsequent optical emission by the defects. Because the intensity of the AC parametric energy modulation depends on the AC field amplitude and/or frequency, the amount of optical absorption of the incident laser by the defects and an optical emission intensity from the defects may depend on the amplitude and/or frequency of the AC signal applied to the electrodes 284 and 282.

As a result, the optical emission from the defects or the absorption of the excitation laser field by the defects in the solid-state device 130 may be coherently modulated as a function of the AC field amplitude and/or frequency as applied to the electrodes 284 and 282. The solid-state device 130 in such a configuration thus may operate as an optical modulator. For example, in one implementation, the laser light from the optical sources 120 may be tuned to be resonant with an electron orbital transition of the defects. When the AC signal of a particular frequency and applied to the electrodes 284 and 282 is zero in amplitude, the defects embedded in the solid-state device 130 absorb from the laser field via an electron orbital optical transition and then emit light. As the AC power is increased, the electron orbital transition may be tuned off resonance with the excitation laser due to the AC parametric energy modulation induced by the AC field and the absorption of laser by the defects decreases, and so does the optical emission from the defects. As the AC power further increases, the AC parametric energy modulation of the electron orbitals of the defects may be such that it leads to a change of optical transition energy between the electron orbitals that matches the energy of a microwave photons at the AC frequency and that the photons from the excitation laser may again be brought into resonance with the induced sidebands of the optical transition of the defects by additionally absorbing a microwave photon or by emitting a microwave photon. As the AC power further increases, the modulation of the absorption of the laser by the defects and the optical emission from the defects iterates, involving assistance from two or more microwave photons. As shown in more detail below in relation to FIG. 9, such optical modulator may also be operable when the excitation laser is tuned off resonance with zero-AC-field optical transition energy between the electron orbitals of the defects by a multiple of the microwave photon energy.

Likewise, the solid-state device 130 under the configuration above may operate as a microwave-to-optical transducer. In particular, when the excitation laser field is tuned off resonance with the electron orbital optical transition in the defects by a multiple of the microwave photon energy, no optical absorption/emission would be realized without any microwave fields. However, in the presence of a microwave field, absorption of the excitation laser by the defects may be induced and coherent light emission from the defects may be generated. As such, the microwave energy is effectively transduced to optical energy via the quantum states of the defects embedded in the solid-state device 130.

Further, the solid-state device 130 under the configuration above may operate as an optical microwave detector. In particular, when the excitation laser field is tuned off resonance with the electron orbital optical transition in the defects, the presence of microwave photons may induce an absorption of the excitation laser and a subsequent emission of light from the defects. Such optical emission may be detected by the optical detector 140 of FIG. 1. As such, a presence of microwave may be detected via the quantum states of the defects embedded in the solid-state device 130 optically. More details for describing the underlying principles for the coherent optical modulation, microwave-to-optical transduction, and optical domain microwave detection operations are provided below in relation to FIG. 9-10.

Still further, the photons emitted from the defects via the coherent interaction between the coherent optical excitation and the microwave field may exhibit controllable optical frequency mixing characteristics. For example, under an optical excitation by the coherent optical field resonant with the optical transition between the ground state and the excited state in the defects, one or more microwave photons may be mixed by the defects with the coherent optical excitation into a coherent optical emission having multiple frequency components. In particular, these frequency components may include a combination of a base frequency component at the ground state to excited state transition energy, and various sidebands that are spaced from the base frequency component by one or a multiple of the microwave photon energy. As such, positions of these optical emission sidebands may be controlled by adjusting the frequency of the microwave field. Further, with a fixed microwave field frequency, the relative magnitude of these various optical frequency components (including the base frequency component and the sidebands) may be controlled by varying the amplitude of the microwave field. The solid-state defects system described herein essentially serve as single color center optical frequency mixer in analogy to a classical electron optical modulator. More details for such optical frequency mixing are provided below in relation to FIG. 11.

Figure 3:
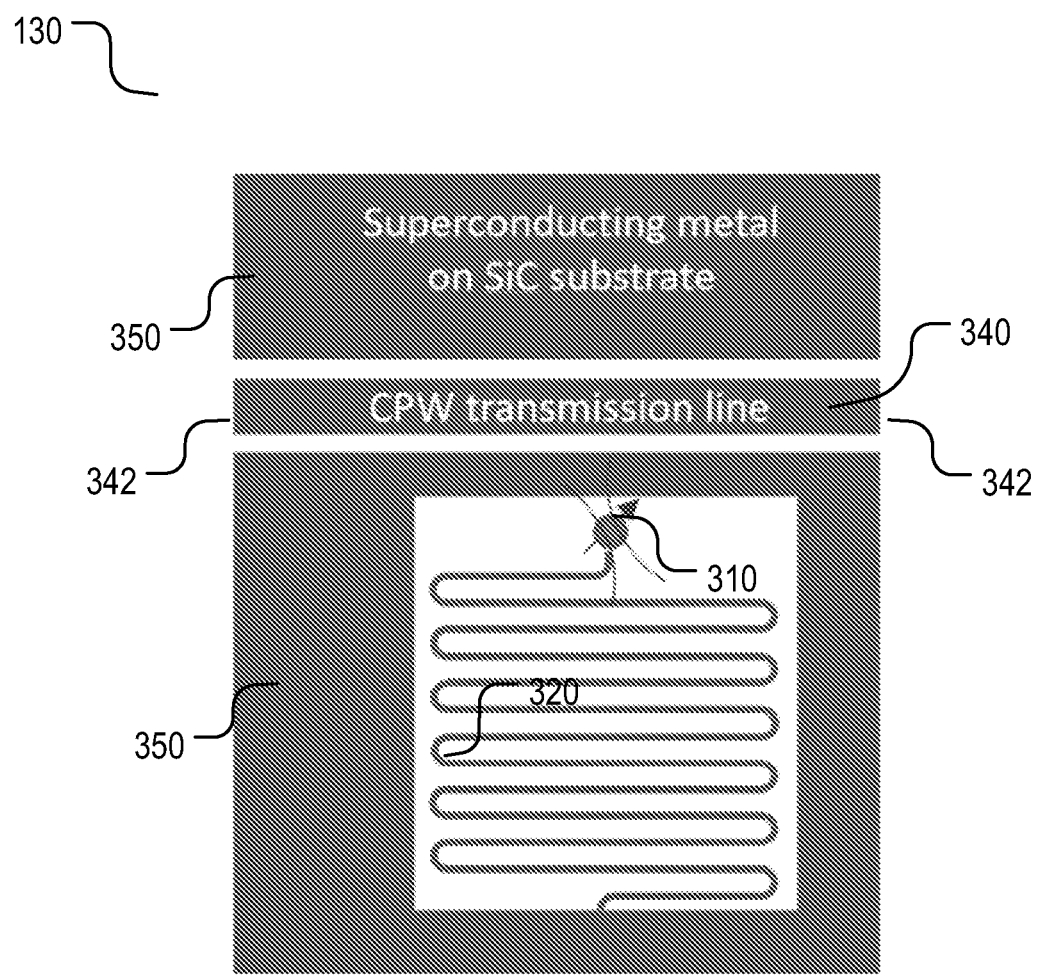
FIG. 3 shows another example solid-state device embedded with defects including a microwave resonator.
Figure 4:
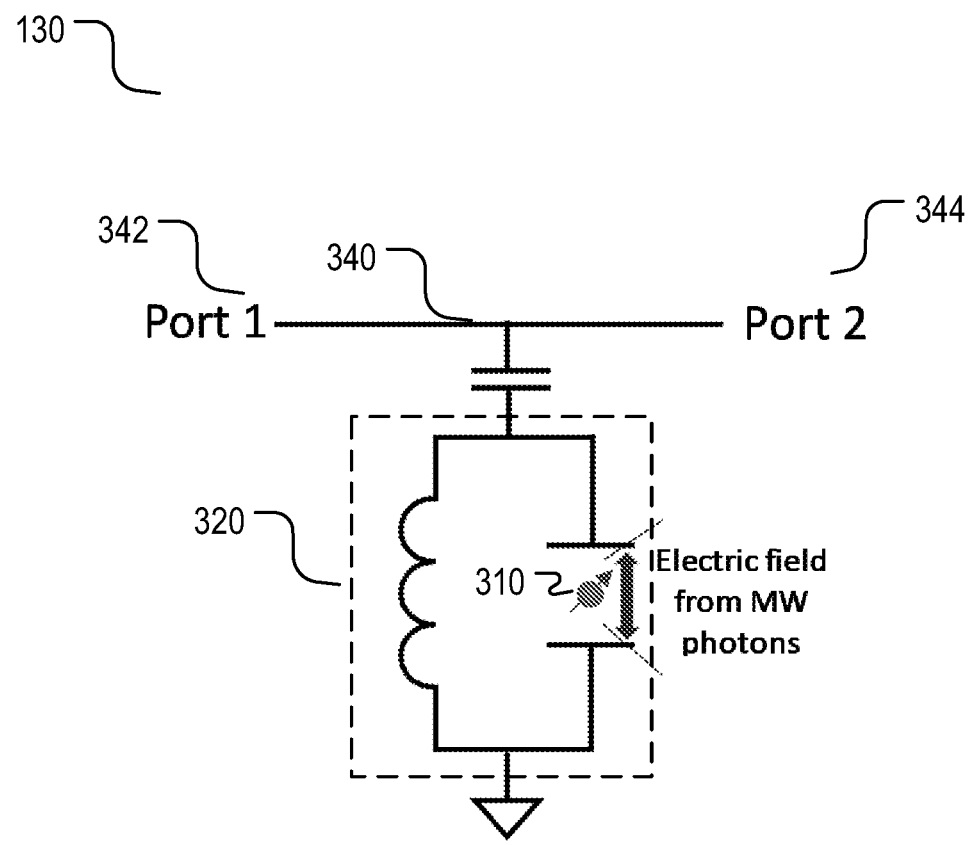
FIG. 4 shows an effective circuit diagram for the solid-state device of FIG. 3.

FIG. 3 illustrates another example implementation of solid-state device 130. The solid-state device 130 of FIG. 3 include defects in a crystalline lattice as shown by 310. The solid-state device further includes a superconducting microwave resonator 320 and a coplanar waveguide (CPW) transmission line 340 to couple microwave photons in and out of the resonator 320. The superconducting microwave resonator 320 may be fabricated use superconducting metal deposited on SiC, as shown by 350. The CPW transmission line 340 has a first port 342 and a second port 344 implemented as electrodes for the solid-state device 130. The CPW transmission line 340 may be fabricated using the superconducting metal. The defect 310 is coupled to the resonator 320 so that the defect experiences the stored electric field energy of the resonator 320. In some implementations, the defects may be embedded within the superconducting microwave resonator 320. FIG. 4 further illustrates an equivalent circuit 400 for the solid-state device 130. As shown in FIG. 4, the defects 310 are effectively enclosed in the superconducting microwave resonator 320 which may be optionally driven via port 1 (342) and port 2 (344).

With the presence of the superconducting microwave resonator 320, the example solid-state device 130 of FIG. 3 may achieve similar functions as the example solid-state device 130 of FIG. 2 with the added benefit of a microwave field enhancement of the non-resonant (non-resonant with spin transition) microwave applied for inducing an AC parametric energy modulation to the quantum states of the defects. The addition of the superconducting microwave resonator 320 provides another benefit. For example, with the optical excitation tuned off resonance by one or a multiple of an energy determined by the fundamental microwave mode in the superconducting microwave resonator 320, and with no AC field applied to the electrode, zero-point quantum fluctuations in the microwave cavity involving microwave photons at, for example, the fundamental mode of the microwave resonator, may lead to induced absorption of the detuned excitation laser and subsequent addition of microwave photons into the superconducting resonator 320 (when the optical excitation is tuned above the resonance) or removal of microwave photons from the superconducting resonator 320 (when the optical excitation is tuned below the resonance) along with subsequent optical emission from the defects, thereby enabling both microwave-to-optical transduction without externally applied AC field, as well as optical-to-microwave transduction by monitoring microwave photon amplitudes at the second port 344 of the CPW transmission line 340.

Figure 5:
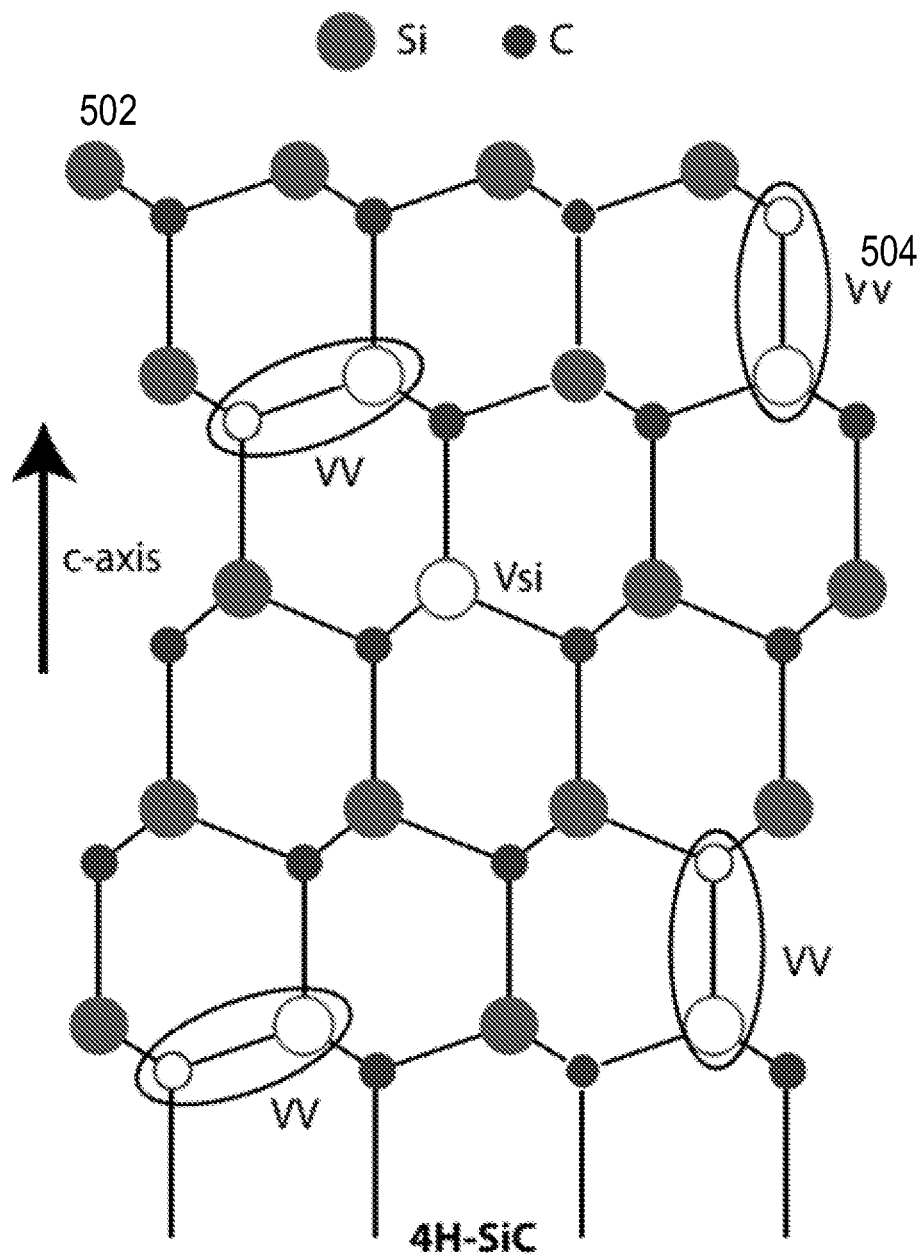
FIG. 5 shows a schematic diagram of an example silicon carbide (SiC) crystalline lattice embedded with defects.

The disclosure below further describes the various example components and underlying principles of the example systems and devices above. FIG. 5 shows an example SiC crystalline lattice embedded with defects. The crystalline lattice 502 may include one of a 3C, 4H, or 6H SiC lattice. The SiC crystalline lattice 502 may further include one or more embedded defects 504. The defects 504 may be divacancies or silicon vacancies ($V_{Si}$). In some implementations, the defects may include a basally-oriented kh divacancy (VV) defect and the SiC crystalline lattice may be in the form of a 4H polytype SiC lattice. The kh VV defect in 4H SiC may include a carbon vacancy $V_c$ adjacent to a silicon vacancy $V_{Si}$ in the kh configuration, where k and h refer to quasi-cubic and hexagonal local environments of the $V_C$ and $V_{Si}$ sites, respectively.

The SiC crystalline lattice with VV defects therein may be fabricated in various manners and configurations. For example, a layer of high-purity i-type SiC of, e.g., 20 micrometers, with $V_c$ and $V_{Si}$ densities of less than, e.g., $1 \times 10^{15}$ cm$^{-3}$, and VV density of less than $2 \times 10^{10}$ cm$^{-3}$, may be epitaxially grown at, e.g., 4° off axis on the Si face of a high-purity semi-insulating SiC substrate. Electron irradiation with 2 MeV electrons at a dose of $3 \times 10^{12}$ e$^-$/cm$^{-2}$ may then be performed to create both $V_c$ and $V_{Si}$ vacancies. Subsequent annealing at, e.g., 850° C. for 30 minutes in Ar may lead to formation of divacancy complexes throughout the SiC crystal line lattice.

The various electrodes may be fabricated on or in the SiC crystalline lattice with VV defects to form the solid-state device 130 of FIGS. 2-4. The defects in the solid-state device 130 may be cooled to below some predefined temperatures, e.g., below 20 K. In some implementations, the defects may be cooled to below 5 K using, for example, any type of cryogenic equipment. Temperature fluctuations may be further controlled to be below a temperature fluctuation threshold, e.g., <10 mK. The upper limit of the operating temperature of the device 130 as an optical modulator, microwave-to-optical transducer, optical microwave detector, or optical mixer may be determined by the types of crystal host and defects in the solid-state device 130. Examples are merely given here for hk VV defects in 4H SiC crystal lattice.

Figure 6:
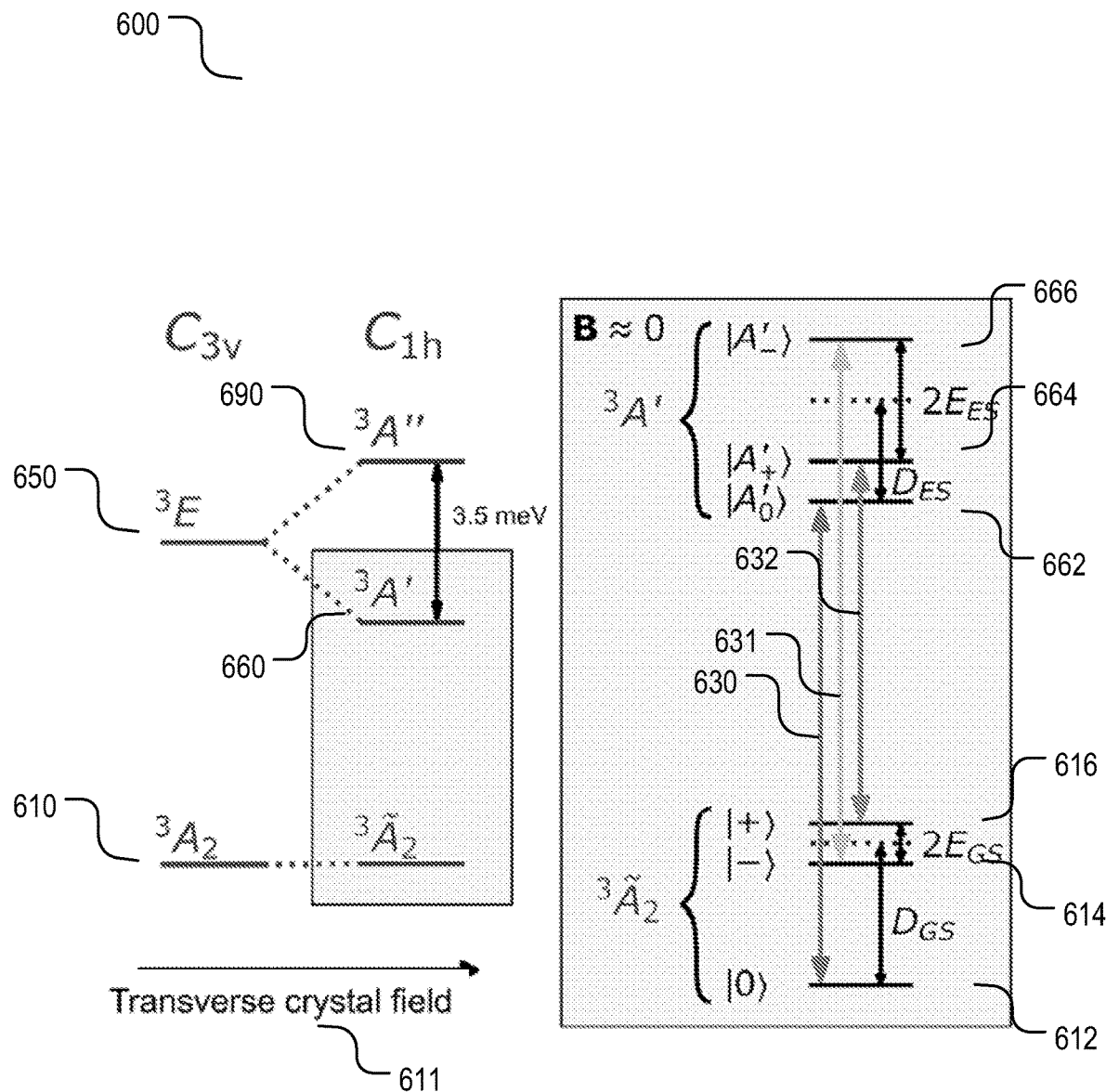
FIG. 6 shows a schematic energy diagram of ground states and excited states of the defects in FIGS. 2-5.

Such VV defects in 4H SiC lattice above may provide electron energy levels and quantum states suitable for implementing the microwave-to-optical energy conversion and the corresponding optical modulation, microwave-to-optical transduction, optical microwave detection, and optical frequency mixing operations described above. FIG. 6 shows a schematic energy level diagram 600 of a selected example subset of electron states of hk VV defect in 4H SiC. Dangling bonds from the six neighboring atoms of the hk VV defect may form a localized spin-1 $^3A_2$-like ground states 610 and $^3$E-like excited states 650 with $C_{1h}$ symmetry. A transverse crystal field 611 intrinsic to the defect manifests in both the ground and excited state structure, mixing the spin eigenbasis and splitting the $^3$E orbital states 650 into two widely separated $^3$A' states 660 and $^3$A" states 690. The energy difference between $^3$A' states 660 and $^3$A" states 690 may be, for example about 3.5 meV.

In the VV defects in 4H SiC, there may be a presence of longitudinal and transverse zero-field splittings $D_{GS}$ and $E_{GS}$, as well as nuclear spin hyperfine interactions. The energy levels of the kh VV ground state triplet may undergo splitting and mixing. When a single, dominant hyperfine interaction represented by A is assumed, two ZEro First-Order Zeeman (ZEFOZ) points located at $B_z$ approximately equaling $\pm A_{zz}/g\mu_B$ may be observed, where $B_z$ is the applied static magnetic field along the defect axis, $A_{zz}$ is the zz component of the hyperfine tensor, g is the electronic g-factor, and $\mu_B$ is the Bohr magneton. The magnetic field needed for placing the ground spin states at the ZEFOZ point may be provided by the magnetic field sources 127 of FIG. 1.

Operating at any of the ZEFOZ points may cause the spin eigenstates to become a mixed basis in terms of $S_z = \{|+1\rangle, |0\rangle, |-1\rangle\}$ spin projection states. Thus, there may be three ground states: a first ground state $|0\rangle$ 612, a second ground state $|-\rangle$ 614, and a third ground state $|+\rangle$ 616:

$$\left\{ |+\rangle = \frac{|+1\rangle + |-\rangle}{\sqrt{2}}, |0\rangle, |-\rangle = \frac{|+1\rangle - |-1\rangle}{\sqrt{2}} \right\}$$

The second ground state 614 may have an energy higher than the first ground state 612 and lower than the third ground state 616. The energy of first ground state and the third ground state may differ by a first ground-separation energy whereas the energy of the second ground state and the third ground state may differ by a second ground-separation energy. These ground states are of the same electron orbital and spin transitions may be driven between the three ground states using resonant microwave fields. The second ground-separation energy may be denoted by $2E_{GS}$, as shown in FIG. 6. The sum of the first ground-separation energy and $E_{GS}$ may be denoted by $D_{GS}$. The energy separation between the third ground state and the first ground state, or the sum of first ground-separation energy and the second ground-separation energy, may be about $D_{GS}$ $E_{GS}$=1.35237 GHz and with the first and second ground-separation energy being about $D_{GS}-E_{GS}$=1.11554 GHz and $2E_{GS}$=36.835 MHz. The ground states 612, 614, and 616 are of the same electron orbital. Spin transitions may be driven between the first ground state 612 and the second ground state 614 with a microwave at or near the first ground-separation energy $D_{GS}-E_{GS}$=1.11554 GHz, between the first ground state 612 and the third ground state 616 with a microwave at or near $D_{GS}+E_{GS}=1.35237$ GHz, and between the second ground state 614 and the third ground state 616 with a microwave at or near the second ground-separation energy $2E_{GS}=36.835$ MHz. A microwave is at or near an energy separation when its frequency is within a predetermined range relative to the energy separation, e.g., within 10% of the energy separation.

Figure 7A:
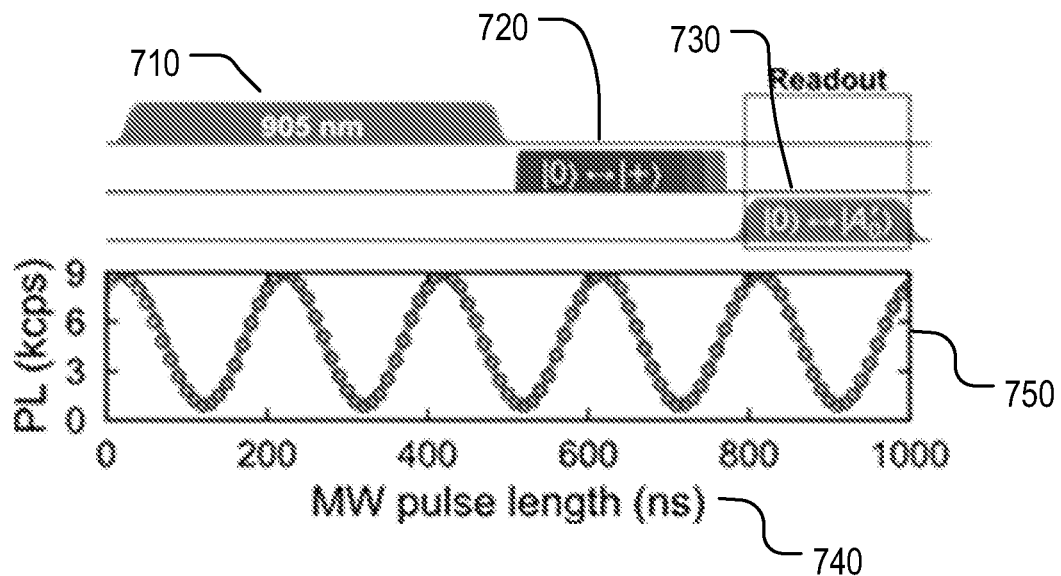
FIG. 7 illustrates Rabi oscillation between spin sublevels in defects embedded in SiC crystalline host induced by resonant microwave excitation.
Figure 7B:
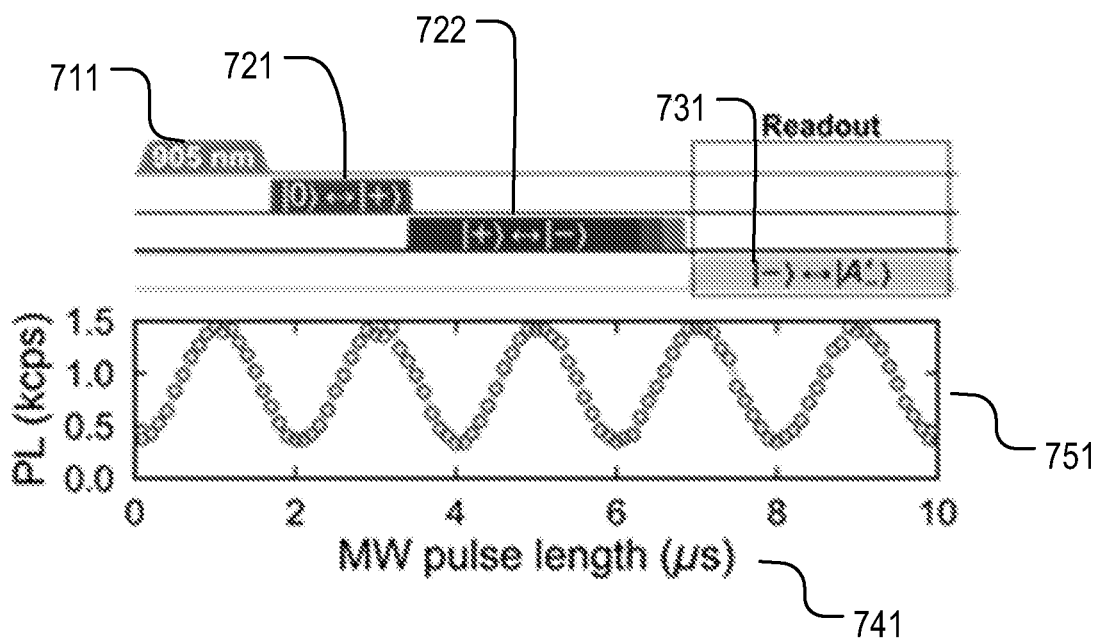

The spin transitions between the ground states 612, 614, and 616 may be coherently driven using one or more resonant microwave fields. As such, the resonant microwave may be used for a preparation of the defects into any of the spin sublevels 612, 614, and 616 of the ground states 610 of FIG. 6. FIGS. 7a and 7b illustrate Rabi oscillations between these ground sublevels that may be observed from the defects under resonant microwave excitation. In FIG. 7a, the defects are first prepared into the |0> spin sublevel 612 of the ground state using a non-resonant optical excitation. For example, a laser field at 905 nm may be used for such preparation, as shown by 710 of FIG. 7a. Thereafter, a microwave field resonant with the |0>612 to |+>616 spin transition may be applied, as shown in 720. As the pulse width of the resonant microwave field 720 is varies, the defects is coherently driven and oscillates between the |0> to |+> sublevels. The probability of the defects in the |0> sublevel may be measured by detecting an optical emission as a result of the defects being excited to the excited states 660 following, for example, a resonant optical excitation from the |0> sublevel of the ground states to the |A'$_0$> sublevel of the states $^3$A' states 660, as shown by 730. The |A'$_0$> sublevel is shown in FIG. 6 as 662 and is described in more detail below. A high-contrast Rabi oscillation 750 is obtained by measuring the optical emission (photoluminescence) as a function of the pulse length of the resonant microwave field 720 applied to drive the spin transition |0> to |+>, as shown by 740.

Further in FIG. 7b, the defects may be first optically prepared into the |0> sublevel of the ground state, similar to FIG. 7a and as shown by 711. Thereafter, the defects may be resonantly excited to the |+> sublevel by using a π pulse resonant with the |0> to |+> spin transitions as shown by 721. Then, an oscillation between the |+> 616 sublevel and the |−> 614 sublevel may be driven by a second microwave 722 resonant with the spin transition between the |+> and the |−> sublevels. The probability of the defects in the |−> sublevel may be optically measures as a photoluminescence as a result of an optical field 731 that resonantly excites the defects from the |−> sublevel to the excited sublevel |A'$_−$>. The |A'$_−$> sublevel of the defects is shown in FIG. 6 as 666 and is described in more detail below. Such photoluminescence indicates Rabi oscillations 751 between the |+> sublevel and the |−> sublevel as a function of the pulse width (axis 741) of the second microwave 722 resonant with the spin transition between the |+> sublevel and the |−> sublevel. The Rabi oscillation 751 in FIGS. 7b and 750 in FIG. 7a show that the defects may be prepared using a combination of non-resonant optical excitation and resonant microwave excitation into any of the spin sublevels 612, 614, and 616 of the ground states 610 in FIG. 6.

Returning to FIG. 6, the excited states 650 of the hk VV defect may also split into more than one fine structure states. They may split into, for example, 6 spin sublevels. Particularly, a large transverse crystal field may separate the six spin sublevels of the $^3$E state 650 into two orbital branches, $^3$A' states 660 and $^3$A" states 690, each containing three sublevels. The $^3$A" states 690 may be more energetic than $^3$A' states 660 by about 3.5 meV, and thus, a fast relaxation from $^3$A" states 690 to $^3$A' states 660 may occur at low temperatures. Because of the large separation of 3.5 meV, when the temperature of the defects is about 5 K (corresponding to a kinetic energy of 0.43 meV), optical absorption and emission from $^3$A' states 660 may be resolved. Neglecting changes in hyperfine interactions between the ground- and excited-state orbitals, the fine structure of the individual orbital branches of $^3$A' and $^3$A" may resemble the ground-state fine structure at the ZEFOZ points. For example, the excited states $^3$A' 660 may include three excited sublevels: a first excited state |A'$_0$> 662, a second excited state |A'$_+$> 664, and a third excited state |A'$_−$> 666, analogous to the first ground state |0> 612, the third ground state |+> 616, and the second ground state |−> 614, respectively. The zero-field splittings of the |A'$_0$>, |A'$_+$>, and |A'$_−$> sublevels are parameterized by DES and EES, as shown in FIG. 6. DES may be about 970 MHz, and EES may be about 483 MHz.

Figure 8:
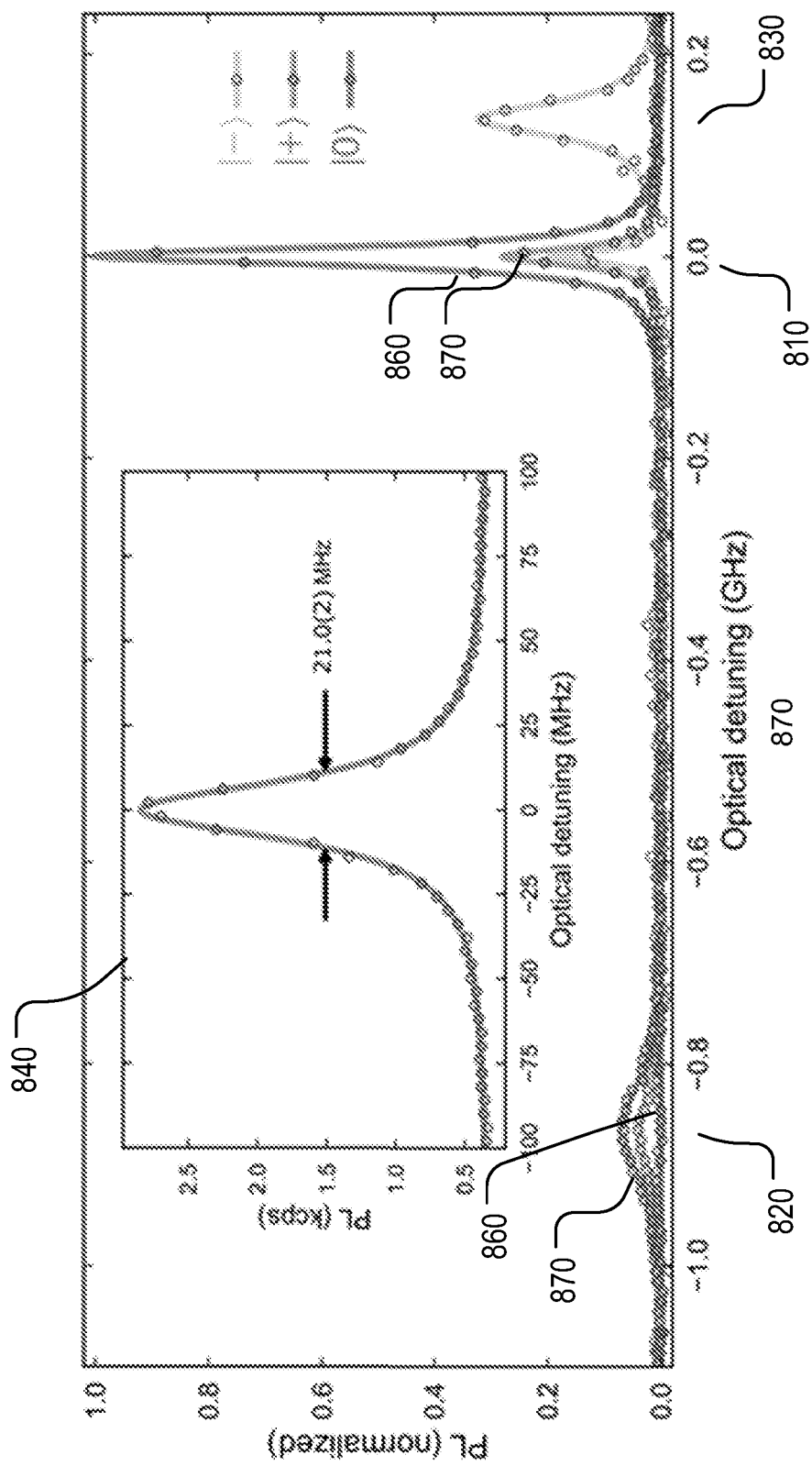
FIG. 8 shows example photoluminescence excitation spectrum of quantum states of defects in a SiC crystalline lattice.

Optical transitions between the ground states and the excited states in FIG. 6 may be allowed, as shown, for example, by arrows 630, 631, and 632. Such optical transitions may be mapped out using spin-dependent photoluminescence excitation (PLE) spectroscopy. Such PLE spectra 800 is shown in FIG. 8. The PLE spectra 800 may be taken by tuning an excitation laser across various resonances 630, 631, and 632 shown in FIG. 6 while detecting phonon assisted photoluminescence from the excited state. Such phonon assisted photoluminescence is detected spectrally away from the excitation wavelength and thus avoid detection background from scattered excitation laser field while providing a way to monitor the extent to which the defects is in the excited state. In practical applications, it may be desired to maintain quantum coherence in the excited state in the optical emission by keeping the optical emission in a zero-phonon line. In some implementations, an optical resonator or cavity having a sufficient Q factor may be included with the solid-state device 130. The optical resonator may be configured with a cavity mode overlapping with the ground-to-excited state transition such that the coherent excited defects may be forced to emit at the zero-phonon line, thereby preserving the quantum coherence in the defects in the optical emission.

The PLE spectra in FIG. 8 shows resonance 810, identified as representing optical transition 630 of FIG. 2 between the ground state 612 and the excited state 662 (|0> to |A'$_0$> transition). In FIG. 8, the optical frequency of the excitation laser is measured as a detuning from the optical transition 630. Further in FIG. 8, two other resonances detuned by about −866.0(7) MHz and about +135.9(3) MHz, shown as resonances 820 and 830, are observed, primarily corresponding to the 630 (|+> <−> |A'+>) and 631 (|−> <−> |A'−>) optical transitions, respectively. The excited state zero-field splittings, DES and EES, may be estimated to be about +970 MHz and about −483 MHz, respectively. A full width at half maximum of the Lorentzian lineshape of the main resonance as shown by an expanded view 840 may be estimated as about 21.0(2) MHz. A DC electric field may be applied via the electrodes described above with respect to FIGS. 2-4 to achieve the narrow PLE width shown in 840 of FIG. 8 by reducing the amount of unwanted free carriers/charges in the SiC crystal and thereby reducing spectral diffusion as a result of fluctuations in electric environment of the defects.

For FIG. 8, the defects are first prepared into one of the ground states 612, 614, and 616 of FIG. 6 before being excited by the excitation laser. Such preparation of the defects may be achieved by a combination of optical initialization and resonant microwave preparation as described above with respect to FIG. 7. For example, the defects may be prepared in to the |0> ground state 612 and the corresponding PLE spectrum shown as curve 860 in FIG. 8 exhibits only a main resonance at 810 due to |0> <-> |A'$_0$> transition. For another example, the defects may be prepared into the |+> ground state 616 and the corresponding PLE spectrum shown as curve 870 in FIG. 8 exhibits a resonance at 820 due to |+> <-> |A'$_+$> transition and a resonance at 810 due excitation of residue population in |0> into |A'$_0$>. For yet another example, the defects may be prepared into the |−> ground state 614 and the corresponding PLE spectrum shown as curve 880 in FIG. 8 exhibits a main resonance at 830 due to |−> <-> |A'$_−$> transition and a resonance at 810 due excitation of residual population in |0> into |A'$_0$>, and a resonance at 820 which may be due to imperfect spin initialization and imperfect spin rotation in the preparation of the defects or other processes.

The various levels of the defects shown in FIG. 6 may be subject to DC Stark shift under externally applied DC field or AC parametric energy modulation under externally applied AC electric field. DC Stark shift characteristics may be measured by applying DC electric field across the electrodes of the solid-state device 130 shown in FIGS. 2-4. The AC parametric energy modulation, as described above, may enable the optical modulation operation, microwave-to-optical transduction operation, optical detection of microwave, and the optical mixing operation. In particular, the coherent optical modulation operation, microwave-to-optical transduction operation, optical detection of microwaves, and optical mixing operation may be based on optical transitions between two of the multiple energy levels and corresponding quantum states of the defects in FIG. 6. The AC parametric energy modulation as a result of applying AC field in the microwave frequency range modifies these energy levels to enable the coherent optical modulation, microwave-to-optical transduction, optical detection of microwave, and optical frequency mixing.

For example, the ground state |0> and the excited state |A'$_0$> of FIG. 6 and the optical transition there between may be used as a basis for these operations. AC electric field concurrent with an optical excitation field may be applied to the defects. The excited state electric dipole moment of, for example, $\Delta\mu_{//}$=4.05 GHz/(MV/m), along the electric field direction may be extracted by measuring the DC Stark shift. The AC electric field may be applied at a particular frequency ω to induce a controlled periodic oscillations of the excited state orbital levels. With proper rotating frame transformation, the Hamiltonian of the two-level system (including the ground state |0> and the excited state |A'$_0$>) under the AC electric field and the optical excitation field becomes:

$$\tilde{H}''(t)/\hbar = \sum_{n=-\infty}^{\infty} \frac{\Delta_n}{2}\left(e^{-in\omega t}\sigma_+ + e^{in\omega t}\sigma_-\right) + \frac{\delta}{2}\sigma_z$$

$$\Delta_n = \Omega J_n\left(\frac{A}{\omega}\right)$$

$$\sigma_\pm = \frac{1}{2}(\sigma_x \pm i\sigma_y)$$

where δ is the optical detuning from the two-level optical transition, Ω is the optical Rabi frequency, Jn(x) are Bessel functions of the first kind, A is the amplitude of the induced Stark shift from the AC electric field (and thus represents the amplitude of the AC electric field), and the σs are the Pauli operators. This Hamiltonian may provide a basis for an exhibition of multiphoton interactions in a Landau-Zener-Stückelberg (LZS) interferogram of PLE spectra when the optical excitation is tuned at and near the resonance between the ground state and the excited state while the amplitude of the AC field is varied. Such interferogram shows that the quantum states of the defects may be coherently driven and controlled to provide the microwave-to-optical energy conversion and the various coherent optical devices described above.

Figure 9A:
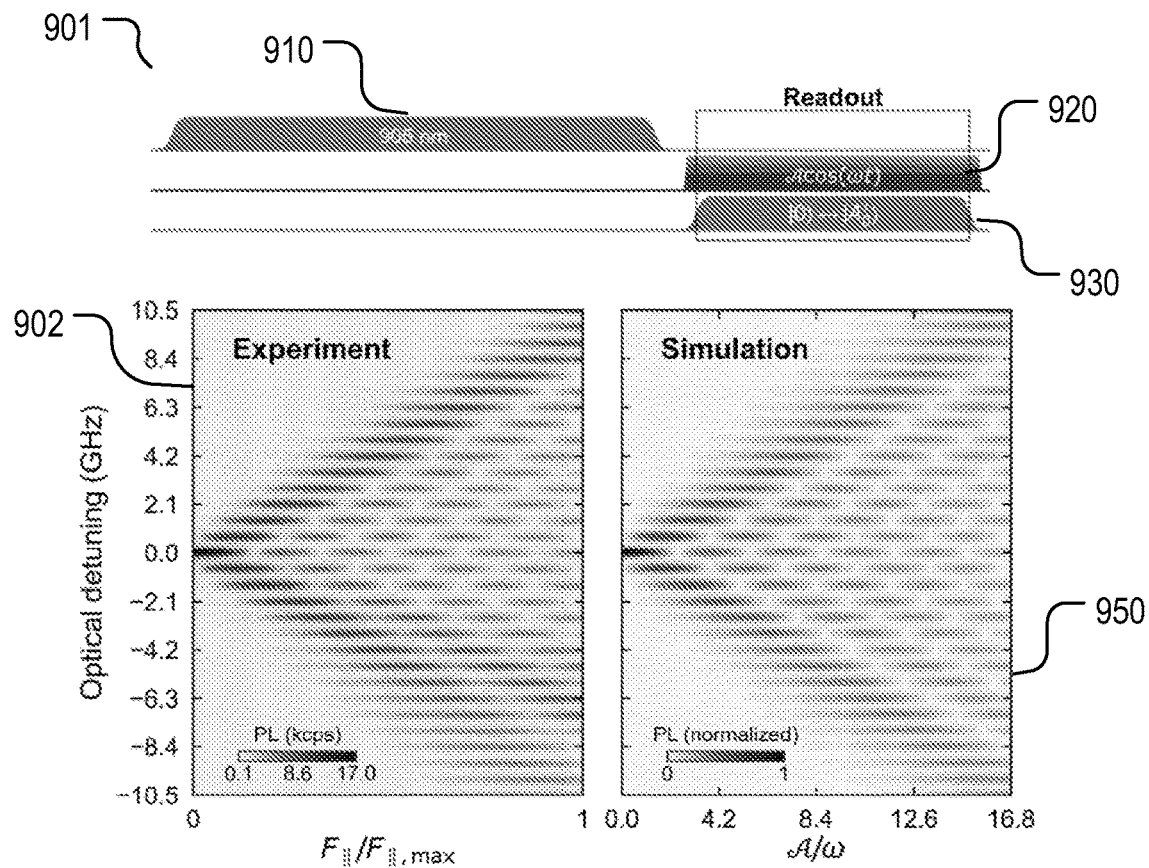
FIGS. 9a-9b illustrate an example Landau-Zener-Stückelberg (LZS) interferogram of photoluminescence excitation (PLE) spectra as a function of an amplitude of an AC field applied to defects in a SiC crystalline lattice.
Figure 9B:
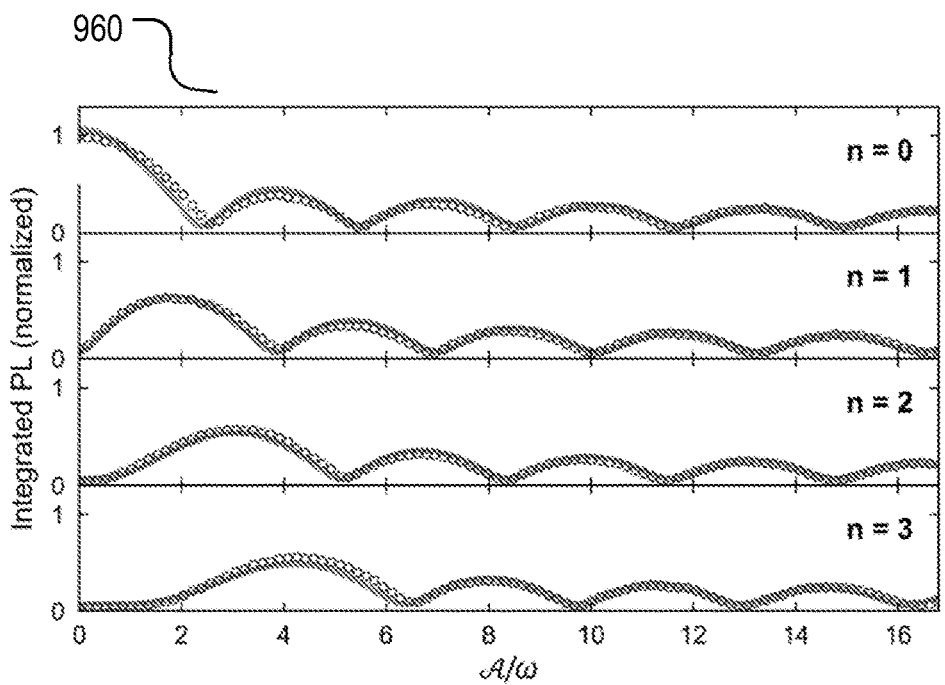

An example LZS interferogram is shown in FIGS. 9a and 9b. In particular, 901 of FIG. 9a illustrates an excitation and detection sequence in time for the LZS interferogram 902. An off-resonant optical excitation 910 is first used to prepare the defects into the ground state |0>. For example, a laser field at 905 nm may be used for such preparation. Thereafter, the AC field shown as 920 is applied concurrently with optical excitation tuned across the transition between the ground state |0> and the excited state |A'$_0$>, while integrated photoluminescence is detected from the defects. The AC electric field 920 may be fixed at a drive tone of, for example, 700 MHz, while its amplitude is varied. The frequency for the AC electric field 920 may be selected at any value such that the AC field is off resonance with any of the possible spin transitions between various spin sublevels shown in FIG. 6.

The example measured LZS interferogram is shown in 902 of FIG. 9a along with a computer simulation 950. The LZS interferogram 902 shows integrated photoluminescence emission intensity as a function of detuning (from the |0> to |A'$_0$> transition) of the optical excitation field 930 and the amplitude of the AC electric field 920 (measured in relative amplitude as $F_{//}/F_{//,max}$, where $F_{//,max}$ may be approximately 2 MV/m). The LZS interferogram 902 shows that, at zero amplitude for the AC electric drive tone, only the bare optical resonance between the ground state |0> and the excited state |A'$_0$> may be observed at zero detuning of the optical excitation field 930. With increasing amplitude of the electric drive tone, multiphoton resonances (microwave photons) at optical excitation detunings equaling an integer number (e.g., 0, ±1, ±2, etc.) of the AC field drive tone frequency may be produced. As shown in 902, coherent interactions with up to 15 microwave photons may be observed at sufficiently high AC field. These coherent interactions are observed even in the absence of any microwave resonator. These interactions may be driven by an AC field with a wide range of microwave frequencies (other than 700 MHz).

FIG. 9b shows slices of integrated photoluminescence as a function of the amplitude of the AC drive field in the LZS interferogram 902 at several optical excitation detunings equaling 0, 1, 2, and 3 multiples of the AC field drive tone frequency. The integrated photoluminescence follows a $$\left|J_n\left(\frac{A}{\omega}\right)\right|$$

dependence, consistent with a theoretical calculation in the strong optical driving regime shown as the solid lines in 960.

The LZS interferogram 902 indicates coherent interactions between microwave and optical photons via the quantum states of the defects and provides the basis of the operations involved in the optical modulation, microwave-to-optical transduction, optical detection of microwaves, and optical frequency mixing described above. For example, as shown by 902, under resonant or near resonant optical excitation, absorption of the optical excitation field by the defects and emission of light from the defects may be controlled by amplitude of the AC field (microwave). Electro-optical modulators by microwaves may thus be constructed via the coherent optical interactions between the optical photons and microwave photons via the quantum states of the defects. Likewise, microwave photons may be converted by the defects into optical photons under the optical excitation, thereby providing a microwave-to-optical transducer. For example, when the optical excitation is tuned off resonance by a multiple of the AC field frequency (700 MHz in this example), there would be no optical emission of photons from the defects. However, photon emission may be induced in a presence of the microwave photons. In essence, the microwave photons may be transduced to optical photons by the defects. Similarly, external microwave photons may be sensed via the defects by the optical detector as transduced optical photons, thereby providing an optical microwave detector.

Further, modulation of the absorption of the optical excitation field and the subsequent optical emission may be generated by varying the frequency of the AC field. In particular, as the LZS interferogram 902 of FIG. 9 depends on (A/w), modulations based on the AC field amplitude and frequency may be equivalent. For example, at each of the resonances corresponding to a particular optical excitation detuning and AC field amplitude in the LZS interferogram 902 of FIG. 9a, the frequency of the AC field (microwave) may be varied, leading a modulation of the absorption of the optical excitation field and the subsequent optical emission. As described below with respect to optical frequency mixing, the optical emission modulated by the frequency of the microwave may exhibits various optical sidebands of optical frequency components.

The LZS interferogram shown in 902 of FIG. 9a is measured using a single tone AC field. In some other implementations, more than one tones may be included in the AC field. In other words, microwave photons of more than one energies may be used in the coherence interaction with the optical photons via the defects, leading to complex interferogram that may enable other types of optical modulation, e.g., an modulation of the absorption of the optical excitation field and the subsequent optical emission based on the phases of the multiple driving tones in the AC field. For example, the AC field may include two tones at col and (02, such that the AC electric field may be expressed as $A_1 \cos(\omega_1 t) + A_2 \cos(\Omega_2 t + \phi)$, where $\phi$ represents a phase between the two frequency tones. An LZS interferogram driven by such two-tone AC electric field along with optical excitation is shown as 1040 in FIG. 10 along with a computer simulation 1050.

For the interferogram 1040, the ground state |0⟩ of the defects is again prepared by off resonance optical excitation at 905 nm, as shown by 1020. Subsequently, a resonant/near resonant optical excitation field 1030 is applied concurrently with the two-tone AC field (microwave) 1020. In this particular implementation, the first tone may be fixed at a $\omega_1$ of, for example, 27 GHz (off resonance with the spin transitions within the ground states and within the excited states of FIG. 6) and the second tone is fixed one octave away at $2\omega_1$, while the amplitudes of both tones are fixed at a first Bessel zero of the base band resonance, where $A_1/\omega_1 = A_2/\omega_2$ approximately equals about 2.4048. The interferogram 1040 shows an integrated photoluminescence as a function of the detuning of the optical excitation field 1030 and the relative phase $\phi$ between the two tones of the AC field 1020.

The interferogram 1040 exhibits multiphoton resonances forming a complex photoluminescence excitation response pattern under two simultaneous AC drive tones separated by an octave. Such a complex pattern may be a result from different time variation of the two-tone AC electric field with different relative phases between the two tones. Such an interferogram shows that optical modulation by the relative phase $\phi$ between the two tones of the AC field may be achieved. In other words, varying the phase $\phi$ between the two tones of the AC field may provide a modulation of the absorption of the optical excitation field that is resonant with or detuned to various multiples of $\omega_1$ from the ground to excited state optical transition in the defects, as well as a modulation of the subsequent optical emission from the defects. For example, for each optical excitation detuning of one or a multiple of $\omega_1$, such modulation of optical absorption or emission may be achieved by varying the relative phase of the two tones of the AC field between two values corresponding to two adjacent high photoluminescence regions along the phase axis in the interferogram 1040. Likewise, microwave-to-optical transduction may also be achieved. Such microwave-to-optical transduction may be conditioned on the relative phase $\phi$ between the two tones of the AC field. In some other implementations, the ration between the frequencies of the two microwave tones may be a rational number.

The example LZS interferograms shown above in FIGS. 9 and 10 are obtained by preparing the defects into the |0⟩ sublevel of the ground state of the hk VV defects in SiC. In some other implementations, the defects may be pure state of other ground state sublevels. Alternatively, the defects may be prepared into coherent superposition of the ground state sublevels. Because of the long spin relaxation and dephasing time (e.g., on the order of up to tens or hundreds of microseconds), such coherent superposition may be long lasting, providing qubits suitable for quantum information processing. For example, the defects may be driven or prepared into a coherent $(|0\rangle+|+\rangle)/\sqrt{2}$, superposition state at the ZEFOZ point. Using the optical and microwave excitation described above for FIGS. 9 and 10 to drive such a superposition state may lead to transduction of microwave photons into optical photons while also entangling the defect spin state with the optical photon state. This may allow for long-distance entanglement protocols to leverage the long-lived quantum coherence of the spin.

Figure 10:
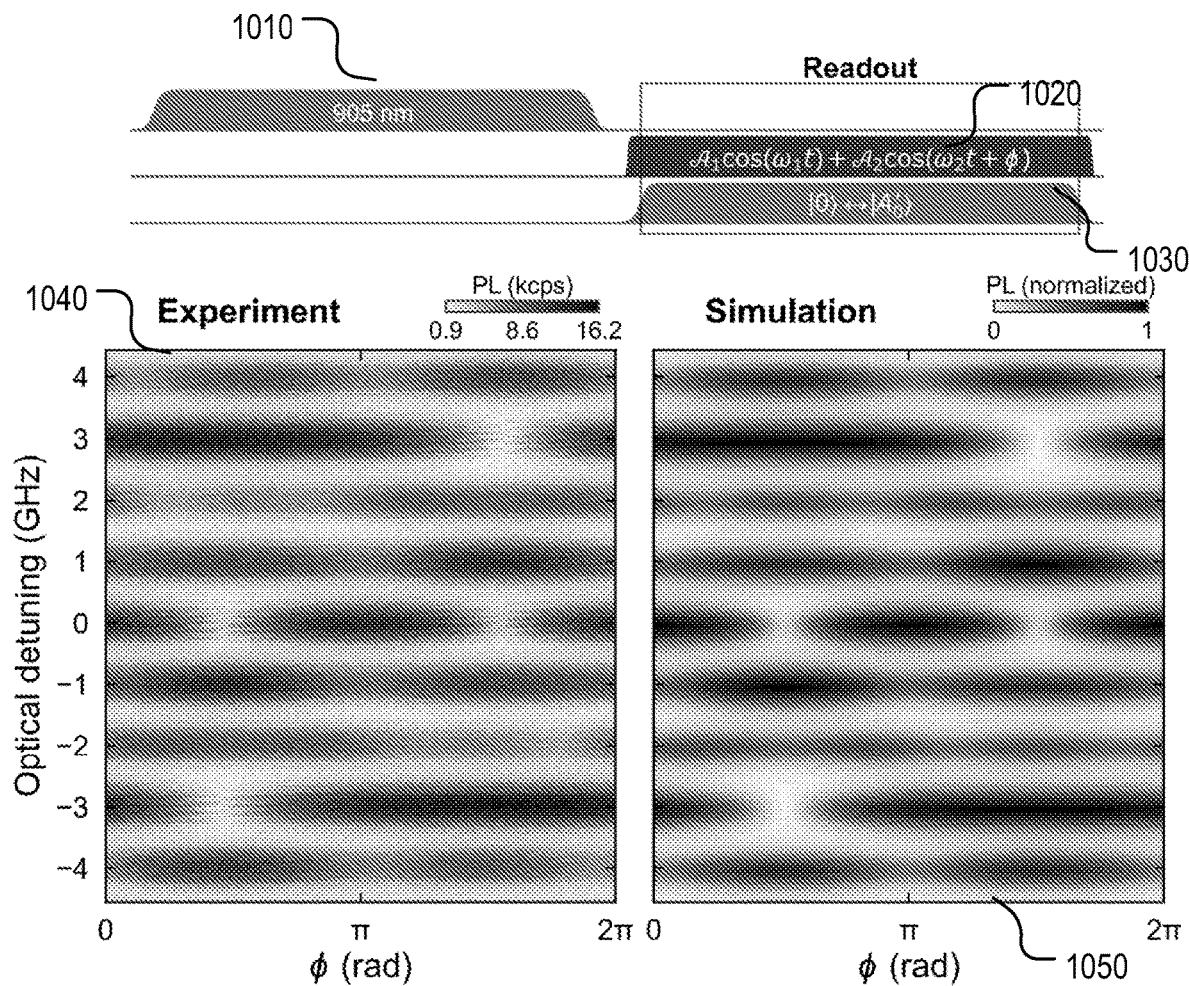
FIG. 10 illustrates an example LZS interferogram of photoluminescence excitation (PLE) spectra as a function of a relative phase between two frequency tones separated by a frequency octave in a two-tone AC field applied to defects in a SiC crystalline lattice.

The example LZS interferograms in FIGS. 9 and 10 further show that a coherent interaction between microwave fields/photons and optical fields/photons via the quantum states of defects may be used to control the optical emission from the defects. With the addition of a microwave resonator shown in FIGS. 3-4, a microwave field matching a cavity mode of the microwave resonator may be greatly enhanced. Additionally, even without any externally applied microwave field, microwave photons may be generated as a result of zero-point or vacuum fluctuations in the resonator. Such microwave photons may then interact with the coherent optical excitation via the quantum states of the defects embedded in the microwave resonator to achieve, for example, the microwave-to-optical transduction described above. For example, the coherent optical field may be detuned below the ground state to excited state optical transition by one or a multiple of an energy determined by a cavity mode in the microwave resonator. Because the optical excitation is off resonance (lower energy than the optical resonance), no optical emission would occur from the defects without a presence of microwave photons. Microwave photons generated via the zero-point or vacuum fluctuations, however, would interact with the optical excitation field via the defects and cause coherent emission of photons. One or more such microwave photons may be effectively transduced into an optical photon under the principles described above. For another example, the coherent optical field may be detuned above the ground state to excited state optical transition by one or an integer multiple of the energy determined by the cavity mode frequency in the microwave resonator. Because the optical excitation is off resonance (higher energy than the optical resonance), no optical emission would occur from the defects without the presence of the microwave resonator. The presence of the microwave resonator leads to interactions that induce absorption of excitation photons and a subsequent coherent emission of resonant photons accompanied by emission or addition of microwave photons into the microwave resonator which are then coupled into the microwave transmission line. As such, either a microwave-to-optical transduction or an optical-to-microwave transduction may be achieved, allowing for optical control of the microwave resonator in general and a number of microwave photons in the microwave resonator in particular.

The example LZS interferograms in FIGS. 9 and 10 show that the coherent interaction between microwave field/photons and optical field/photons via the quantum states of defects may be used to control an amount of optical emission from the defects, and thus may provide the basis for the optical modulation, microwave-to-optical transduction, and optical detection of microwaves described above. These interferograms further show that the spectral composition of the optical emission from the defects may be controlled by such coherent interaction. In particular, the photons emitted from the defects via the coherent interaction between the coherent optical excitation and the microwave field may exhibit controllable optical frequency mixing characteristics, as shown in the optical emission spectra 1100 in FIG. 11.

Figure 11:
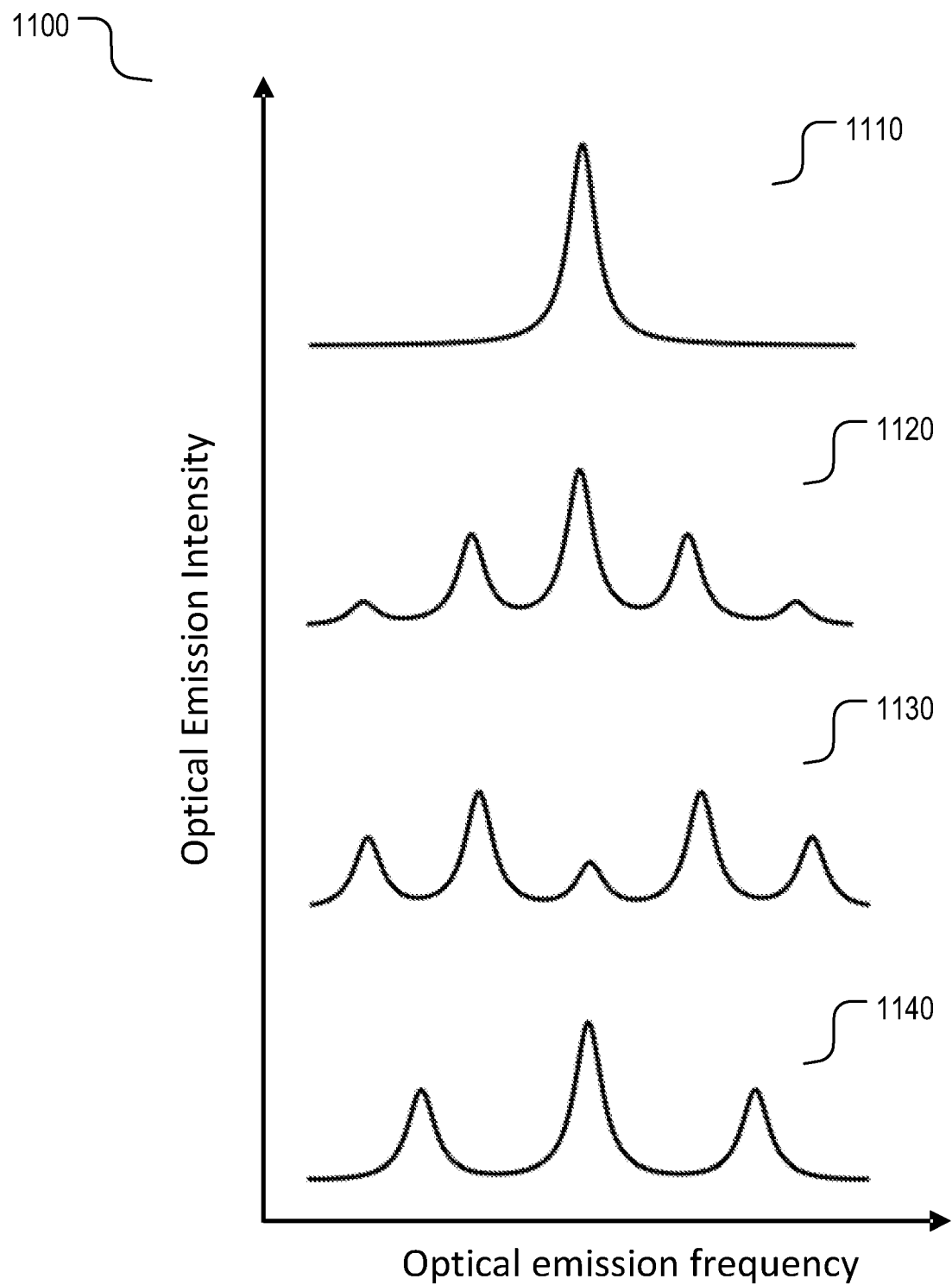
FIG. 11 illustrates optical frequency mixing by quantum states in defects in a SiC crystalline lattice.

For example, as shown in emission spectrum 1110 of FIG. 11, when the coherent optical excitation is tuned in resonance at $f_0$ with the ground state to the excited state optical transition in the defects, and the amplitude of an microwave field of frequency $f_1$ is set at zero, the defects are driven by the coherent optical excitation and emit only at the $f_0$. When the amplitude of the microwave at frequency $f_0$ is increased, optical sidebands appear together with the frequency component at $f_0$ in the coherent optical emission by the defects, as shown by 1120 of FIG. 11. The optical sidebands are spaced from $f_0$ by one or a multiple of $f_1$. As further shown in emission spectrum 1130, the optical sidebands grow in intensity and in number (not explicitly shown in FIG. 11) while the frequency component at $f_0$ decreases, when the amplitude of the microwave field further increases. As further shown in spectrum 1140 of FIG. 11, where the microwave frequency is modified to $3/2\ f_1$, the spacing between the optical sidebands may be tuned by adjusting the microwave frequency.

As shown by the spectra 1100 of FIG. 11, the coherent optical emission from the defects coherently driven by an optical excitation field interacting with a microwave field via the quantum states of the defects may contain various spectral components as a result of optical-microwave frequency mixing. The relative positions and spacings of these optical emission frequency components may be controlled by adjusting the frequency of the microwave field. Further, with a fixed microwave field frequency, the relative magnitude of these various optical frequency components (including the base frequency component and the sidebands) may be controlled by varying the amplitude of the microwave field. The solid-state defect system described herein essentially serves as a single color center optical frequency mixer analogous to a classical electro-optical modulator.

FIG. 12 shows an example flow diagram 1200 of a method for performing electro-optical modulation, microwave-to-optical transduction, and/or optical detection of microwaves. In Step 1210, a crystalline lattice embedded with a defect is fabricated and provided. An example of 4H SiC crystalline lattice embedded with hk VV defects are given above. In Step 1220, the defect may be driven by an excitation optical field as described in more detail above. In Step 1230 a microwave field may be applied to the defect simultaneously with the excitation optical field to modulate the absorption of the excitation optical field by the defect and optical emission from the defect by varying the amplitude or frequency of the microwave field. Alternatively or additionally, in Step 1240, microwave photons may be applied to the defect and transduced to optical photons. Alternatively or additionally, in Step 1250, optical detection of the optical emission from the defect may be performed to determine presence of microwave photons at the defect.

The energy (optical frequency) of the optical excitation field may be appropriately configured for a particular frequency of microwave for modulation, transduction, or detection, as described in more detail above. As described above, the defect may include a ground state and an excited state for generating the optical emission. The excitation optical field may be resonant or near resonant with a transition between the ground state and the excited state. A sum or difference between the optical frequency of the excitation optical field and one or a multiple of the microwave frequency may be resonant with the transition between the ground state and the excited state.

FIG. 13 shows an example flow diagram 1300 of a method for performing microwave to optical transduction. In Step 1310, a crystalline lattice embedded with a defect is fabricated and provided. An example of 4H SiC crystalline lattice embedded with hk VV defects are given above. In Step 1320, the defect may be driven by an excitation optical field as described in more detail above. In Step 1330, microwave photons may be generated as a result of zero-point fluctuations in the microwave resonator. The microwave photons may be generated in any of the cavity modes in the microwave resonator. In Step 1340, the microwave photons may be transduced into optical photons via emission from the defect. The energy (optical frequency) of the optical excitation field may be appropriately configured for a particular frequency of microwave cavity mode of the microwave resonator. As described above, the defect may include a ground state and an excited state for generating the optical emission. The excitation optical field may be resonant or near resonant with a transition between the ground state and the excited state. A sum or difference between the optical frequency of the excitation optical field and one or a multiple of the microwave frequency of a cavity mode of the microwave resonator may be resonant with the optical transition between the ground state and the excited state.

As shown above, novel interactions between optical and microwave fields or photons in a solid-state system embedded with defects via coherent coupling between electric fields and the quantum orbitals states of the defects may enable microwave-optical devices that can convert between energies of drastically different scale and range while maintaining quantum coherences. These defects may be addressed and manipulated individually in isolation but with spatial proximity, enabling scalable quantum information transfer and scalable architecture for multi-qubit interactions in quantum information processing.

The disclosed systems and methods are described above with reference to the accompanied drawings that form a part of the present application and show. The described systems and methods, however, are not meant to be limiting. This disclosure may be embodied as methods, devices, components, or systems. Accordingly, embodiments of the disclosed system and methods may, for example, take the form of hardware, software, firmware or any combination thereof. Various modifications of the illustrative embodiments and additional embodiments of the disclosure will be apparent to one of ordinary skill in the art from this description. Those skilled in the art will readily recognize that these and various other modifications can be made to the example embodiments, illustrated and described herein, without departing from the spirit and scope of the present disclosure. It is, therefore, contemplated that the appended claims will cover any such modifications and alternate embodiments. Certain proportions within the illustrations may be exaggerated, while other proportions may be minimized. Accordingly, the disclosure and the figures are to be regarded as illustrative rather than restrictive Throughout the specification and claims, terms may have nuanced meanings suggested or implied in context beyond an explicitly stated meaning. Likewise, the phrase "in one embodiment/implementation" or "in some embodiments/implementations" as used herein does not necessarily refer to the same embodiment and the phrase "in another embodiment/implementation" or "in other embodiments/implementations" as used herein does not necessarily refer to a different embodiment/implementation. It is intended, for example, that claimed subject matter may include combinations of example embodiments/implementations in whole or in part.

In general, terminology may be understood at least in part from usage in context. For example, terms, such as "and", "or", or "and/or," as used herein may include a variety of meanings that may depend at least in part upon the context in which such terms are used. In addition, the term "one or more" or "at least one" as used herein, depending at least in part upon context, may be used to describe any feature, structure, or characteristic in a singular sense or may be used to describe combinations of features, structures or characteristics in a plural sense. Similarly, terms, such as "a", "an", or "the", again, may be understood to convey a singular usage or to convey a plural usage, depending at least in part upon context. In addition, the term "based on" or "determined by" may be understood as not necessarily intended to convey an exclusive set of factors and may, instead, allow for existence of additional factors not necessarily expressly described, again, depending at least in part on context.

The invention claimed is:

1. A method for performing electro-optical modulation, comprising:
    providing a crystalline lattice embedded with a defect;
    driving an optical transition between a ground quantum state and an excited quantum state of the defect with an excitation optical field to generate an optical emission from the defect; and
    applying a microwave electric field to interact with the excitation optical field via the defect to modulate the optical emission from the defect,
    wherein a sum or difference between an optical frequency of the excitation optical field and one or a multiple of a microwave frequency of the microwave electric field is resonant with the optical transition between the ground quantum state and the excited quantum state of the defect.

2. The method according to claim 1, wherein the excitation optical field is resonant or near resonant with the optical transition between the ground quantum state and the excited quantum state of the defect.

3. The method according to claim 1, further comprising controlling an intensity of the excitation optical field, an amplitude of the microwave electric field, or microwave frequency of the microwave electric field to produce an amplitude modulation of the optical emission from the defect.

4. A method for performing electro-optical modulation, comprising:
    providing a crystalline lattice embedded with a defect;
    driving an optical transition between a ground quantum state and an excited quantum state of the defect with an excitation optical field to generate an optical emission from the defect; and
    applying a microwave electric field to interact with the excitation optical field via the defect to modulate the optical emission from the defect;
    controlling a number of spectral components or relative intensity between the spectral components of the optical emission from the defect by adjusting an amplitude or a microwave frequency of the microwave electric field.

5. A method for performing electro-optical modulation, comprising:
    providing a crystalline lattice embedded with a defect;
    driving an optical transition between a ground quantum state and an excited quantum state of the defect with an excitation optical field to generate an optical emission from the defect; and
    applying a microwave electric field to interact with the excitation optical field via the defect to modulate the optical emission from the defect;
    wherein:
    the microwave electric field comprises two microwave frequency tones; and
    the method further comprises controlling a relative phase between the two microwave frequency tones to produce an amplitude modulation of the optical emission from the defect.

6. The method of claim 5, wherein a ratio of a frequency of a first of the two microwave frequency tones and a frequency of a second of the two microwave frequency tones is a rational number.

7. A device for performing electro-optical modulation, the device comprising:
    a crystalline lattice;
    a defect embedded in the crystal lattice; and
    two electrodes adapted to apply a microwave electric field to the defect,
    wherein:
    the device is adapted to receive an excitation optical field to drive an optical transition between a ground quantum state and an excited quantum state of the defect to generate an optical emission from the defect; and
    the defect is adapted to serve as a quantum medium for an interaction between the excitation optical field and the microwave electric field applied via the two electrodes for modulating the optical emission from the defect.

8. The device according to claim 7, wherein the excitation optical field is resonant or near resonant with the optical transition between the ground quantum state and the excited quantum state of the defect.

9. The device according to claim 7, wherein a sum or difference between an optical frequency of the excitation optical field and one or a multiple of a microwave frequency of the microwave electric field is resonant with the optical transition between the ground quantum state and the excited quantum state of the defect.

10. The device according to claim 7, wherein the device is adapted to receive the excitation optical field with intensity modulation, or control an amplitude or frequency of the microwave electric field to produce an amplitude modulation of the optical emission from the defect.

11. The device according to claim 7, wherein the two electrodes are adapted to control a number of spectral components or relative intensity between the spectral components of the optical emission from the defect by controlling an amplitude or a microwave frequency of the microwave electric field.

12. The device according to claim 7, wherein the two electrodes are adapted to apply the microwave electric field comprising two microwave frequency tones and to control a relative phase between the two microwave frequency tones to produce an amplitude modulation of the optical emission from the defect.

13. The device of claim 12, wherein a ratio of a frequency of a first of the two microwave frequency tones and a frequency of a second of the two microwave frequency tones is a rational number.

14. A device for performing microwave-to-optical transduction, the device comprising:
a crystalline lattice;
a defect embedded in the crystal lattice;
a microwave transmission line on the crystalline lattice comprising two electrodes; and
a microwave resonator coupled to the microwave transmission line and to the defect, the microwave resonator being adapted for generating or storing one or more microwave photons,
wherein the device is adapted to:
receive an excitation optical field to drive an optical transition between a ground quantum state and an excited quantum state of the defect;
absorb an optical photon from the excitation optical field; and
convert the one or more microwave photons into an emitted optical photon from the defect or convert the absorbed optical photon into the stored one or more microwave photons as a result of an interaction between the excitation optical field and the one or more microwave photons via the defect.

15. The device according to claim 14, wherein a sum or difference between an optical frequency of the excitation optical field and a microwave frequency corresponding to a total energy of the one or more microwave photons is resonant with the optical transition between the ground quantum state and the excited quantum state of the defect.

16. The device according to claim 14, wherein the one or more microwave photons correspond to a cavity mode of the microwave resonator.

17. The device according to claim 14, wherein the microwave resonator comprises a superconducting microwave resonator.

18. The device according to claim 14, wherein the one or more microwave photons are generated by the microwave resonator as a result of a zero-point fluctuation in the microwave resonator.

19. The device according to claim 14, wherein the microwave transmission line comprises a superconducting microwave transmission line.

* * * * *